(12) United States Patent
Younis et al.

(10) Patent No.: US 6,721,368 B1
(45) Date of Patent: Apr. 13, 2004

(54) TRANSMITTER ARCHITECTURES FOR COMMUNICATIONS SYSTEMS

(75) Inventors: Saed Younis, San Diego, CA (US); Emilija Simic, La Jolla, CA (US); Thomas Wilborn, San Diego, CA (US); Haitao Zhang, San Diego, CA (US); Daniel Filipovic, Solana Beach, CA (US); Ralph Kaufman, La Mesa, CA (US); Ming (Jason) Yu Lin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/519,734

(22) Filed: Mar. 4, 2000

(51) Int. Cl.[7] ............................................... H04L 27/04
(52) U.S. Cl. ...................... 375/295; 375/297; 375/345; 455/126; 330/129
(58) Field of Search ................................. 375/295, 297, 375/345; 455/126, 91; 330/129

(56) References Cited

U.S. PATENT DOCUMENTS

| | | | |
|---|---|---|---|
| 5,504,457 A | 4/1996 | Jensen | |
| 5,590,418 A | 12/1996 | Holoubek et al. | |
| 5,697,073 A | 12/1997 | Daniel et al. | |
| 5,752,171 A | * 5/1998 | Akiya | 455/126 |
| 6,016,312 A | 1/2000 | Storm et al. | |
| 6,304,139 B1 | * 10/2001 | Kanno | 330/133 |

FOREIGN PATENT DOCUMENTS

| | | |
|---|---|---|
| EP | 0434294 | 12/1990 |
| EP | 0797299 | 9/1997 |
| EP | 0883250 | 12/1998 |
| EP | 0939501 | 9/1999 |
| EP | 0961402 | 12/1999 |
| WO | 9931799 | 6/1999 |

OTHER PUBLICATIONS

Invitation to Pay Additional Fees/Search Report.

* cited by examiner

Primary Examiner—Temesgchen Ghebretinsae
(74) Attorney, Agent, or Firm—Philip R. Wadsworth; Charles D. Brown; George C. Pappas

(57) ABSTRACT

Transmitter architectures for a communications system having improved performance over conventional transmitter architectures. The improvements include a combination of the following: faster response time for the control signals, improved linearity, reduced interference, reduced power consumption, lower circuit complexity, and lower costs. For a cellular application, these improvements can lead to increased system capacity, smaller telephone size, increased talk and standby times, and greater acceptance of the product. Circuitry is provided to speed up the response time of a control signal. The control loop for various elements in the transmit signal path are integrated. A gain control mechanism allows for accurate adjustment of the output transmit power level. Control mechanisms are provided to power down the power amplifier, or the entire transmit signal path, when not needed. The gains of the various elements in the transmit signal path are controlled to reduce transients in the output transmit power, and to also ensure that transients are downward.

21 Claims, 25 Drawing Sheets

TRANSMITTER ARCHITECTURES FOR COMMUNICATIONS SYSTEMS

CROSS REFERENCE TO RELATED APPLICATIONS

This application is related to U.S. Patent Application Serial No. 09/517,766 entitled "DIGITAL-to-ANALOG INTERFACE CIRCUIT HAVING ADJUSTABLE TIME RESPONSE," filed on the same day herewith, and incorporated herein by reference.

BACKGROUND OF THE INVENTION

The present invention relates to electronics circuits in communications systems, and more particularly to transmitter architectures that provide improved performance.

The design of a high performance transmitter is made challenging by various design considerations. For many applications, high performance is required to meet system specifications. High performance can be characterized by the linearity of the transmit signal path, a wide dynamic range to control the transmit power, and other characteristics. Moreover, for some applications such as cellular communications systems, power consumption is an important consideration because of the portable nature of the cellular telephones. Cost is also a major consideration for many transmitter designs that are incorporated into mass-produced consumer products. High performance, low power consumption, and low costs are generally conflicting design considerations.

These various design considerations effect the performance and acceptance of many consumer products such as, for example, cellular telephones. Examples of cellular communications systems include Code Division Multiple Access (CDMA), Time Division Multiple Access (TDMA), and analog frequency modulation (FM) communications systems. CDMA communications systems are disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention and incorporated herein by reference. CDMA communications systems are also defined by "TIA/EIA/IS-95-A Mobile Station-Base Station Compatibility Standard for Dual-Mode Wideband Spread Spectrum Cellular System" and "TIA/EIA/IS-95-B Mobile Station—Base Station Compatibility Standard for Wideband Spread Spectrum Cellular System," both of which are incorporated herein by reference.

In CDMA communications systems, nonlinearity in the transmitter generates intermodulation distortion that acts as noise and degrades system performance. To reduce nonlinearity, the elements in the transmit signal path are designed to operate in their linear regions and, as the result, consume large amounts of power. Wide dynamic range is required to adequately control the output transmit power. In CDMA systems, the transmit power level is adjusted to provide the required system performance (i.e., a particular bit error rate), low interference to other units, and reduced power consumption. Low power consumption by the transmitter allows for the use of a smaller sized battery, which often translates to a smaller sized telephone. Smaller size is highly desirable because of the portable nature of the telephone. Low power consumption by the transmitter further allows for increased talk and standby times for a specified battery size.

As can be seen, transmitter architectures that provide high performance, low power consumption, and low costs are highly desirable.

SUMMARY OF THE INVENTION

The invention provides controller circuits that govern the operation of transmitters for a communications system to provide improved performance over conventional transmitters. The improvements include a combination of the following: faster response time for the control signals, improved linearity in the output power adjustment, reduced interference, reduced power consumption, lower circuit complexity, and lower costs. For a cellular application, these improvements can lead to increased system capacity, smaller telephone size, increased talk and standby times, and greater public acceptance of the products.

An aspect of the invention provides a transmitter in a communications system that includes a variable gain element, a power amplifier section, and a controller circuit. The variable gain element has a variable gain covering a particular gain range. The power amplifier section couples to the variable gain element and includes a number of discrete gain settings, with one of the gain settings being a bypass setting. The controller circuit provides the control signals for the variable gain element and the power amplifier section. The gains of the variable gain element and the power amplifier section are updated in a manner to reduce transients in the output transmit power and to provide linear adjustment of the output transmit power level. The variable gain element and the power amplifier section are also controlled to reduce power consumption, e.g., by powering down one or more sections when not needed.

Another aspect of the invention provides a method and apparatus for adjusting a gain of a circuit element in a transmitter. In accordance with this method and apparatus, a gain control signal that includes gain setting values for the circuit element is received. Overdrive pulses corresponding to changes in the gain setting values are then generated. The overdrive pulses are summed with the gain setting values to generate an adjusted control signal, which is filtered to generate a filtered control signal. The gain of the circuit element is then adjusted in accordance with the filtered control signal. The overdrive pulses can have amplitudes that are related to the magnitude of the changes in the gain setting values and can also have programmable duration.

Another aspect of the invention provides a method and apparatus for adjusting signal gain in a transmitter having a first gain element and a second gain element. The first gain element responds to a first update clock and the second gain element responds to a second update clock. The first and second update clocks are asynchronous. In accordance with this method and apparatus, the first and second gain transfer characteristics of the first and second gain elements, respectively, are determined. A gain compensation table is then generated based on the first and second gain transfer characteristics. During normal operation, first and second gain setting values for the first and second gain elements, respectively, are received. The second gain setting value is adjusted with a particular gain offset value based on the first gain setting value. A linearized gain setting value corresponding to the adjusted second gain setting value is then retrieved from the gain compensation table. The gains of the first and second gain elements are adjusted with first and linearized gain setting values, respectively.

Another aspect of the invention provides a method and apparatus for adjusting signal gain in a transmitter having a first gain element and a second gain element. The first gain element responds to a first update clock and the second gain element responds to a second update clock. The second update clock is faster than the first update clock and the first and second update clocks are asynchronous. In accordance with the method and apparatus, the first and second gain setting values are received for the first and second gain elements, respectively. The first and second gain control signals representative of the first and second gain setting values, respectively, are then generated. The first and second gain control signals are aligned with the first and second update clocks, respectively. Changes in the gain setting value of the first gain element are detected. If a change in the gain setting value is detected, the second gain control signal is aligned with the first update clock; and if no change in the gain setting value is detected, the second gain control signal is aligned with the second update clock. The gains of the first and second gain elements are adjusted with the aligned first and second gain control signals, respectively.

Another aspect of the invention provides a method and apparatus for providing linear adjustment of output power level from a transmitter. The transmitter includes an element having a number of discrete gain settings and an element having a continuously variable gain setting. In accordance with the method and apparatus, a gain transfer function of the transmitter is determined for each of the discrete gain settings. For each of the discrete gain settings, a gain compensation table is generated based on the determined gain transfer function. A first gain setting value for the element having discrete gain settings is received. The first gain setting value identifies one of the discrete gain settings. A second gain setting value for the element having variable gain setting is also received. A compensated gain setting value is retrieved from the gain compensation table corresponding to discrete gain setting identified by the first gain setting value. The gain of the element having discrete gain settings is adjusted with the first gain setting value, and the gain of the element having the variable gain setting is adjusted with the compensated gain setting value.

Another aspect of the invention provides a method and apparatus for controlling transients in the output power of a transmitter during a signal transmission. The transmitter includes a first element having a first time response and a second gain element having a second time response. The first time response is faster than the second time response. In accordance with the method and apparatus, first and second commands are received to adjust the gains of the first and second elements, respectively. The first command is delayed by a particular time period. The gains of the first and second gain elements are adjusted with delayed first command and the second command, respectively. The particular time period is selected to reduce increase in output power level of the transmitter due to adjustment of the gains of the first and second elements. In an embodiment, the first command is delayed when an increase in the gain of the first element is detected.

Another aspect of the invention provides a method and apparatus for controlling a power amplifier in a transmitter during a signal transmission. In accordance with the method and apparatus, the required output transmit power level is first determined. If the required output transmit power level is below a particular threshold, the power amplifier is bypassed and powered down. If the required output transmit power level exceeds the particular threshold, the power amplifier is powered up for at least a particular warm up period and then selected for use. The power amplifier can be powered down when not in use. The selection and bypassing/powering down of the power amplifier can be performed at times corresponding to boundaries of transmitted code symbols to minimize degradation in system performance. In a similar manner, the transmit signal path (e.g., the transmit RF and IF chain), as well as the biasing circuitry, can be powered down when not in use.

The foregoing, together with other aspects of this invention, will become more apparent when referring to the following specification, claims, and accompanying drawings.

DESCRIPTION OF THE SPECIFIC EMBODIMENTS

Transmitter Architectures

Figure 1:
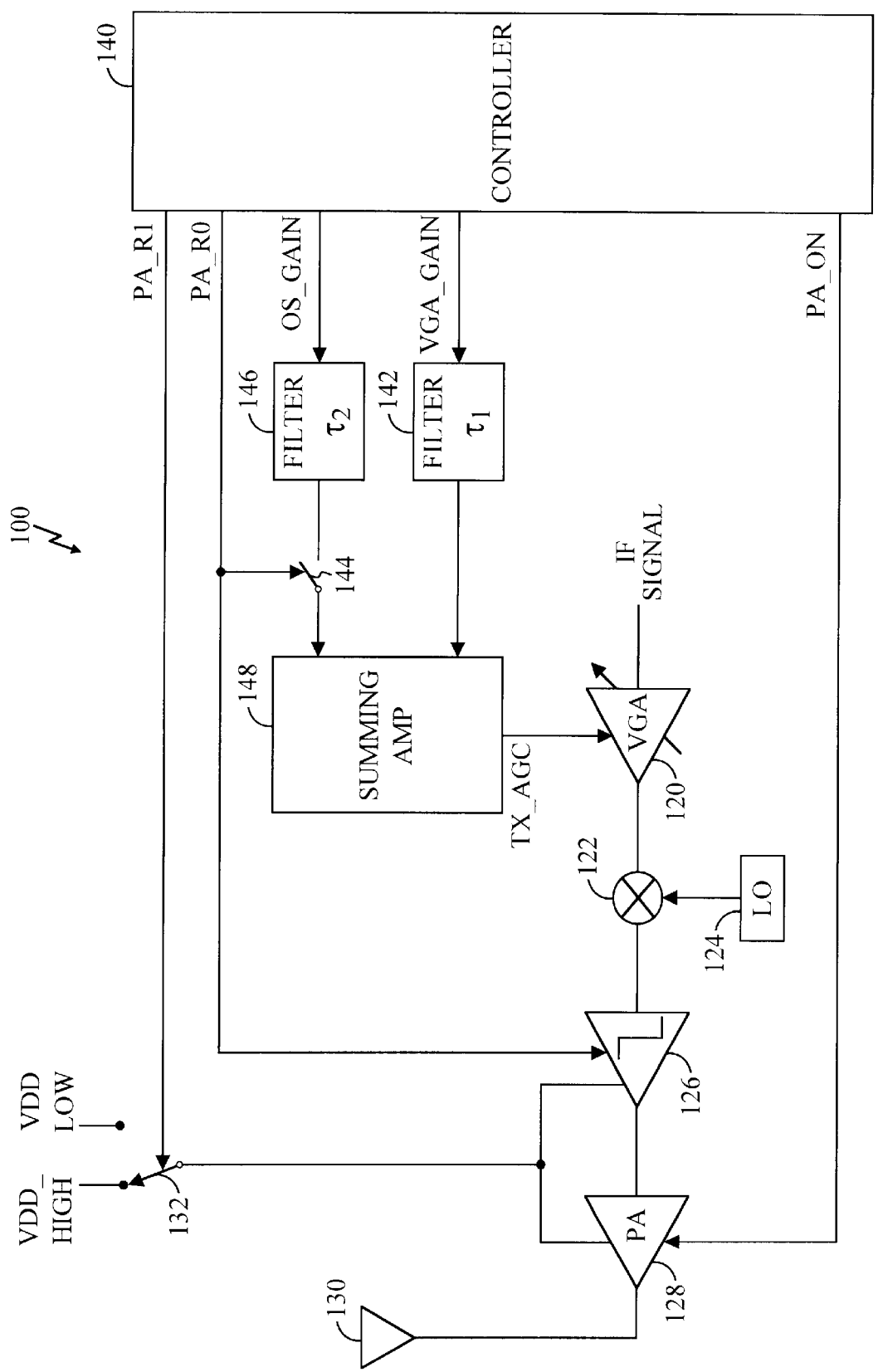
FIG. 1 shows a block diagram of an embodiment of a transmitter for a communications system.

FIG. 1 shows a block diagram of an embodiment of transmitter 100 for a communications system. The transmitter shown in FIG. 1 can be used for various applications including cellular telephone, high definition television (HDTV), cable television, and others. Within the transmit path, the intermediate frequency (IF) signal is amplified by a variable gain amplifier (VGA) 120, upconverted to radio frequency (RF) by a mixer 122 with a sinusoidal from a local oscillator (LO) 124, amplified by a driver 126, and buffered by a power amplifier (PA) 128 that drives an antenna 130. Driver 126 and power amplifier 128 couple to either a high supply source (VDD_high) or a low supply source (VDD_low), depending on the required linearity, via a switch 132 that is controlled by a control signal PA_R1. The transmit chain of transmitter 100 includes elements in the transmit signal path (i.e., from mixer 122 to antenna 130), but not support circuitry such as local oscillator 124. The transmit chain includes mixer 122, driver 126, and PA 128.

In the embodiment shown in FIG. 1, PA 128 provides a fixed gain (e.g., 29 dB) when enabled by a control signal PA_ON, and driver 126 provides a first gain or a second gain (e.g., 26 dB or −2 dB, respectively) depending on the state of the control signal PA_R0. VGA 120 provides adequate gain control to cover the dynamic range (e.g., 85 dB) required by system specifications. A controller 140 generates the control signals that activate PA 128, set the gain of driver 126, control the biasing of PA 128 and driver 126, and set the gain of VGA 120.

Transmitter 100 is required to meet various system specifications. For CDMA applications, the transmitter is required to operate with up to a specified amount of nonlinearity and to provide the specified dynamic range. Nonlinearity is reduced, in part, by providing a high power supply ($V_{DD\_high}$) to driver 126 and PA 128 at high transmit power levels and by selecting the proper gain (e.g., high gain) for driver 126. Although driver 126 can operate at one of two gain settings, the required dynamic range is provided by VGA 120 for the reasons described below.

In the transmitter architecture shown in FIG. 1, driver 126 and PA 128 are controlled by a mechanism having one update rate and VGA 120 is controlled by another mechanism having a second update rate. Typically, the low gain state of driver 126 is achieved by bypassing or powering down the high power driver stages. When driver 126 changes gain state, a gain glitch and an undesirable and unpredictable phase shift often occur. These adverse effects degrade the performance of the system. As a result, the gain of driver 126 is switched at a slow rate to reduce the deleterious effects. In contrast, the gain control mechanism of VGA 120 has an update rate that is typically faster than that of driver 126. The faster update rate is used to quickly adjust the gain of the transmit signal path in response to rapid changes in operating conditions.

In CDMA communications systems, the update clock for the driver-PA control mechanism and the update clock for the VGA control mechanism are locked in frequency but may not be (and are usually not) locked in phase. Essentially, these update clocks can be viewed as being asynchronous. Because of system design considerations as described below, the update clock for the driver-PA control mechanism is derived from a modulator of the unit in which the transmitter reside (e.g., the subscriber unit), and the update clock for the VGA control mechanism is derived from the demodulator.

The mechanism that controls driver 126 and PA 128 generally has a faster response time than that of the mechanism that controls VGA 120. As shown in FIG. 1, the control signals (PA_R0 and PA_R1) for driver 126 and PA 128 are digital in nature and have (relatively) quick transition time. In contrast, the control signal VGA_GAIN for VGA 120 is filtered by a lowpass filter 142 having a particular time response $\tau_1$. The bandwidth for filter 142 is designed to be narrow to reduce the amplitude of the ripples on the gain control signal TX_AGC to a particular value, as required by system specifications. The narrow bandwidth results in a (relatively) long response time (e.g., $\tau_1 \cong 330 \mu sec$) for a step change in the control signal VGA_GAIN.

For at least some of the reasons stated above (i.e., different update rates, asynchronous update clocks, and different response times), the driver-PA control mechanism and the VGA control mechanism are typically designed to operate independently from each other. However, to maintain approximately constant output transmit power level as the gain of driver 126 is switched from a low gain setting to a high gain setting, and vice versa, the two control mechanisms are coupled. When the gain of driver 126 is switched between gain settings, a sudden gain step is introduced in the transmit chain that would result in a change in the output transmit power level. In order to compensate for this gain step, the gain of VGA 120 is adjusted with an offsetting gain to provide approximately similar overall transmit signal path gain before and after driver 126 is switched. For example, if driver 126 is switched from a gain of −2 dB to a gain of +26 dB, the gain of VGA is decreased by 28 dB at approximately the same time to compensate for the driver gain change. The response time of VGA 120 should closely match that of driver 126. If the gain of driver 126 is switched and the gain of VGA 120 is not properly adjusted (i.e., because of a slow response time), a gain transient occurs that causes a corresponding transient in the output transmit power. The power transient can cause degradation in the performance of the transmitter.

FIG. 1 shows an implementation that synchronizes the two control mechanisms to reduce gain transient when the driver is switched. Lowpass filter 142 couples to controller 140, and receives and filters the variable control signal VGA_GAIN to generate analog voltages that are provided to summing amplifier 148. The control signal PA_R0 for driver 126 couples to and controls a switch 144 that is coupled between a lowpass filter 146 and a summing amplifier 148. Filter 146 couples to controller 140, and receives and filters the constant control signal OS_GAIN to generate a constant analog voltage that is provided to summing amplifier 148. Amplifier 148 then sums the received voltages to generate the VGA control signal TX_AGC.

Thus, as the gain of driver 126 is switched, a corresponding fixed gain offset voltage (i.e., the filtered OS_GAIN) is provided to VGA 120. This gain offset voltage adjusts the gain of VGA 120 in the opposite direction to maintain an approximately constant overall transmit signal path gain. The response times of amplifier 148 is negligible and approximates the response time of driver 126 to a change in the control signal PA_R0. The gain offset voltage is not added digitally (i.e., within controller 140) before filter 142 because the response time of filter 142 (approximately 330

μsec) is too slow relative to the fast (and typically negligible) response time of driver 126.

The transmitter architecture shown in FIG. 1 is suboptimal for several reasons. First, because of the independent operation of the gain control mechanisms for driver 126 and VGA 120, the entire dynamic range requirement (e.g., 85 dB) is imposed on VGA 120. This wide dynamic range requirement results in a challenging and power consuming VGA design. Second, the additional components (e.g., externally—switch 144, filter 146, and summing amplifier 148; and internally—additional PDM for the D/A conversion of the signal OS_GAIN) needed to maintain approximately constant output transmit power level as driver 126 is switched increase the transmit hardware complexity and costs.

The transmitter architecture shown in FIG. 1 also fails to meet certain system requirements. For example, TIA/EIA/IS-98-A requires the mean output power level from the transmitter to be within 0.3 dB of the final value in less than 500 μsec following the receipt of a valid power control bit. A wide-bandwidth power control mechanism having fast settling time is required to meet this specification. The processing time required to receive and determine the validity of a power control bit can be as much as 400 μsec, leaving the transmitter with only 100 μsec to respond to a detected valid power control bit. If the response time of filter 142 is greater than 100 μsec (approximately 330 μsec in a typical design), this specification is difficult (if not improbable) to meet.

As can be seen, various design considerations and system requirements impose speed and accuracy requirements on the gain control mechanism for the transmit chain.

Figure 2:
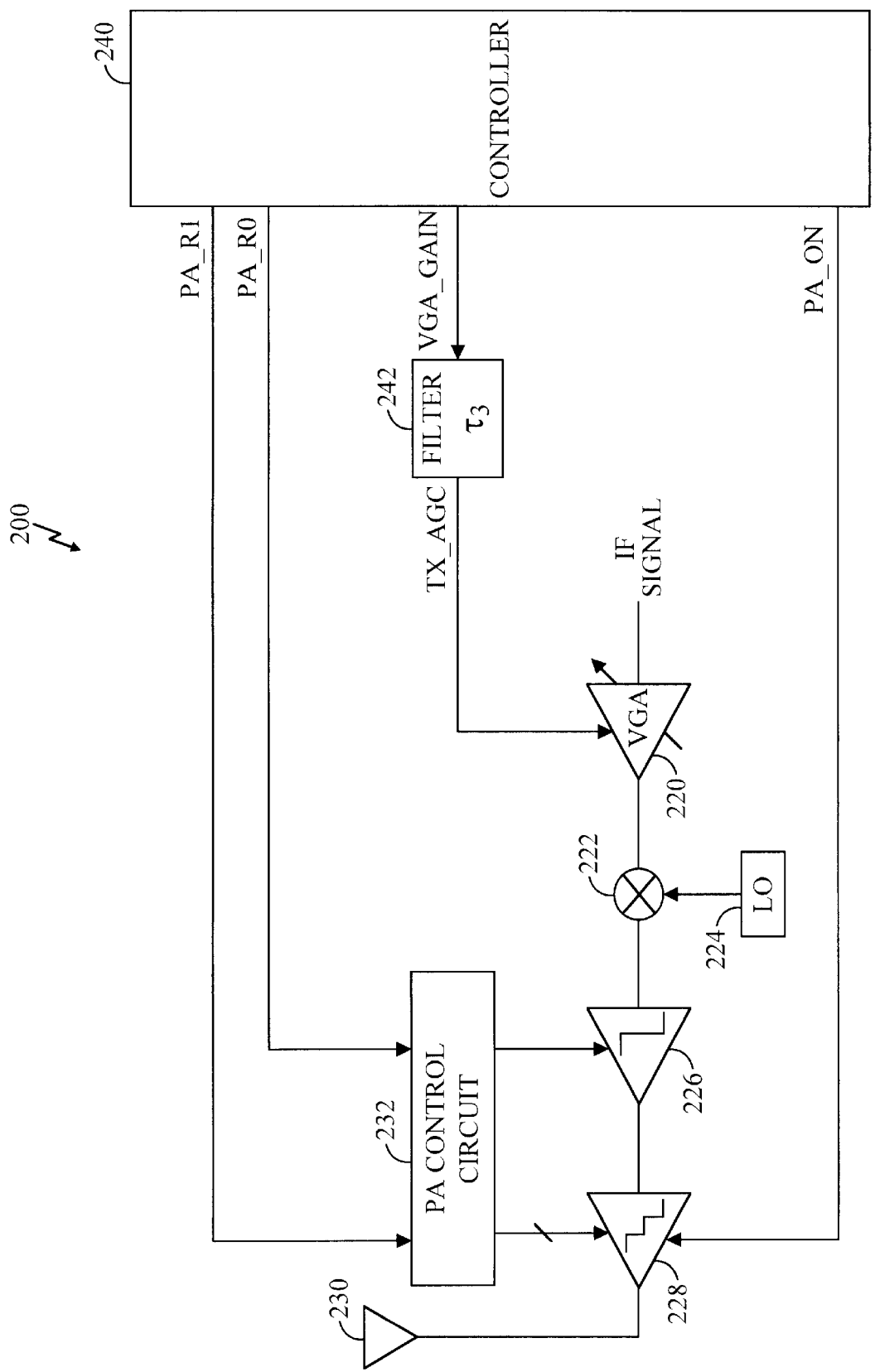
FIG. 2 shows a block diagram of an embodiment of a transmitter that provides advantages over the transmitter in FIG. 1.

FIG. 2 shows a block diagram of an embodiment of a transmitter 200 that provides advantages over transmitter 100 in FIG. 1. Within the transmit path, the IF signal is amplified by a VGA 220, upconverted to RF by a mixer 222 with a sinusoidal from a local oscillator 224, amplified by a driver 226, and buffered by a PA 228 that drives an antenna 230. Driver 226 and PA 228 couple to a PA control circuit 232 that receives the control signals PA_R0 and PA_R1 from a controller 240. The transmit chain of transmitter 200 includes VGA 220, mixer 222, driver 226, and PA 228. PA control circuit 232 can also be implemented within controller 240.

In the specific embodiment shown in FIG. 2, PA 228 has three gain settings and driver 226 has two gain settings. The PA gain settings include low gain, high gain, and bypass, and the driver gain settings include low gain and high gain. Controller 240 generates the control signals that activate PA 228, set the gains of driver 226 and PA 228, control the biasing of driver 226 and PA 228, and set the gain of VGA 220. The VGA gain control signal VGA_GAIN is provided to a filter 242 that filters the signal to generate a gain control signal TX_AGC that is provided to VGA 220.

Transmitter 200 includes the following features and advantages. First, the gain control mechanisms for the gain elements (VGA 220, driver 226, and PA 228) are integrated to provide improved performance, as described below. The integration of the control mechanisms is enabled, in part, by circuitry that provides faster response time for the VGA gain control signal.

Second, the dynamic range requirement is distributed across the gain elements in the transmit chain. With the integrated gain control mechanism, potentially three gain settings for PA 228 and two gain settings for driver 226 can be used to provide some of the required dynamic range, thereby reducing the dynamic range requirement for VGA 220. For example, the dynamic range requirement of 85 dB (which is provided by VGA 120 in FIG. 1) can be distributed such that driver 226 and PA 228 provide 55 dB of dynamic range and VGA 220 provides the remaining 30 dB of dynamic range. With a lower dynamic range requirement, VGA 220 can be designed to be more power efficient, thereby reducing power consumption, and can also be implemented at RF (which may be required for direct upconversion transmitter architectures).

Additional benefits and advantages based on improvements in the transmitter architecture in FIG. 2 are further described below.

Figure 3:
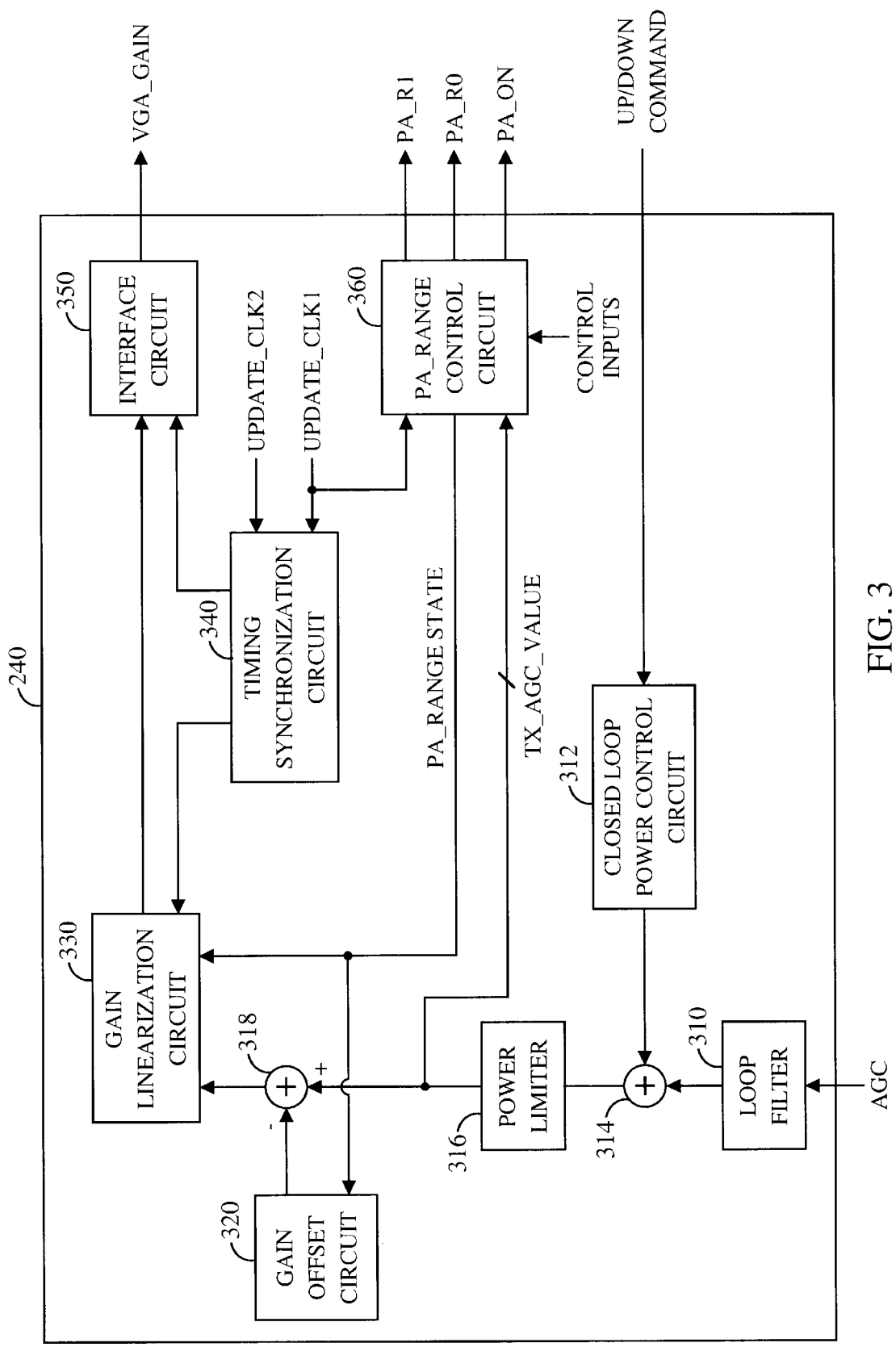
FIG. 3 shows a block diagram of an embodiment of a controller that generates the control signals for the transmitter in FIG. 2.

FIG. 3 shows a block diagram of an embodiment of controller 240 that generates the control signals for transmitter 200. Within controller 240, an automatic gain control (AGC) signal is provided to a loop filter 310 that filters the control signal. An up/down command is provided to a closed loop power control circuit 312 that generates a step gain value in response to the received up/down command. The output from loop filter 310 and the output from power control circuit 312 are provided to a summer 314 and combined. The combined signal from summer 314 is then provided to a power limiter 316 that limits the signal to prevent excessive transmission from transmitter 200. The limited signal from limiter 316 is provided to a summer 318 that also receives a gain offset signal from a gain offset circuit 320. Summer 318 sums the two input signals to generate a gain signal that is provided to a gain linearization circuit 330. Gain linearization circuit 330 generates a compensated (i.e., "linearized") control signal that accounts for nonlinearities of the gain elements in the transmit chain. The compensated control signal is provided to an interface circuit 350 that generates the control signal VGA_GAIN. A PA_RANGE control circuit 360 receives control inputs indicative of the operation mode of the transmitter, the desired operating characteristics, and a TX_AGC value. Control circuit 360 then, in response, directs the operation of gain linearization circuit 330 and generates the control signals PA_R0, PA_R1, and PA_ON. A timing synchronization circuit 340 synchronizes the VGA control signal with the driver-PA control signals. The operation of each of the elements in controller 240 is further described in detail below.

Gain Control Mechanism Having Fast Response Time

A gain control mechanism having a fast response time provides several advantages. First, with a fast response time, the control signal for the VGA and the gain offsetting signal for the VGA (i.e., due to switching of the gains of the driver-PA) can both be digitally generated and combined to create a single combined VGA gain control signal. For the transmitter architecture shown in FIG. 1, an additional PDM, an additional set of switch 144 and filter 146, as well as op-amp summing circuitry 148 would be required to generate and couple a particular gain offset signal for each possible change in the gains of the driver-PA. Thus, if the drive-PA includes four possible gain settings, three sets of PDMs, switches, and filters are needed to generate three offset signals corresponding to the three possible changes in driver-PA gain from a nominal driver-PA gain, as well as the op-amp summing circuitry. The additional switches, filters, and op-amp summing circuitry increase the transmitter hardware complexity. In addition, for four possible gain settings, a currently available controller 140 may not be able to provide the additional required PDMs.

In accordance with one aspect of the invention, the gain offset signals for the VGA (i.e., due to changes in the driver-PA gain) are digitally generated and digitally summed with the gain control signal for the VGA to generate a single overall gain control signal for the VGA. As the result, only one PDM and one external lowpass filters needed to generate the VGA gain control signal. However, as described above, the time response of driver 226 and PA 228 to changes in their control signal can be relatively fast. The gain offsetting signals for the VGA should have an approximately similar time response to minimize gain transient in the transmit signal path. This is achieved by designing lowpass filter 242 with a wide bandwidth to provide a response time that approximately matches the response times of driver 226 and PA 228. In a specific embodiment, filter 242 has a 70% settling time of approximately 10 μsec, which enables the transmitter to conform to IS-98A requirements. Increasing the time constant of filter 242 increases the ripple amplitude on the control signal TX_AGC. In a typical implementation, the control signal VGA_GAIN is a pulse density modulated (PDM) signal comprising a sequence of high and low values. The high and low values are filtered by filter 242 to obtain an averaged value. An analog control signal, corresponding to the averaged value, drives the VGA. The high and low values produce ripples in the analog control signal that degrades the performance of the transmitter. To reduce the ripple amplitude, additional filtering can be performed (i.e., by reducing the filter bandwidth). The additional filtering, while reducing ripple amplitude, slows down the response time correspondingly.

Figure 4:
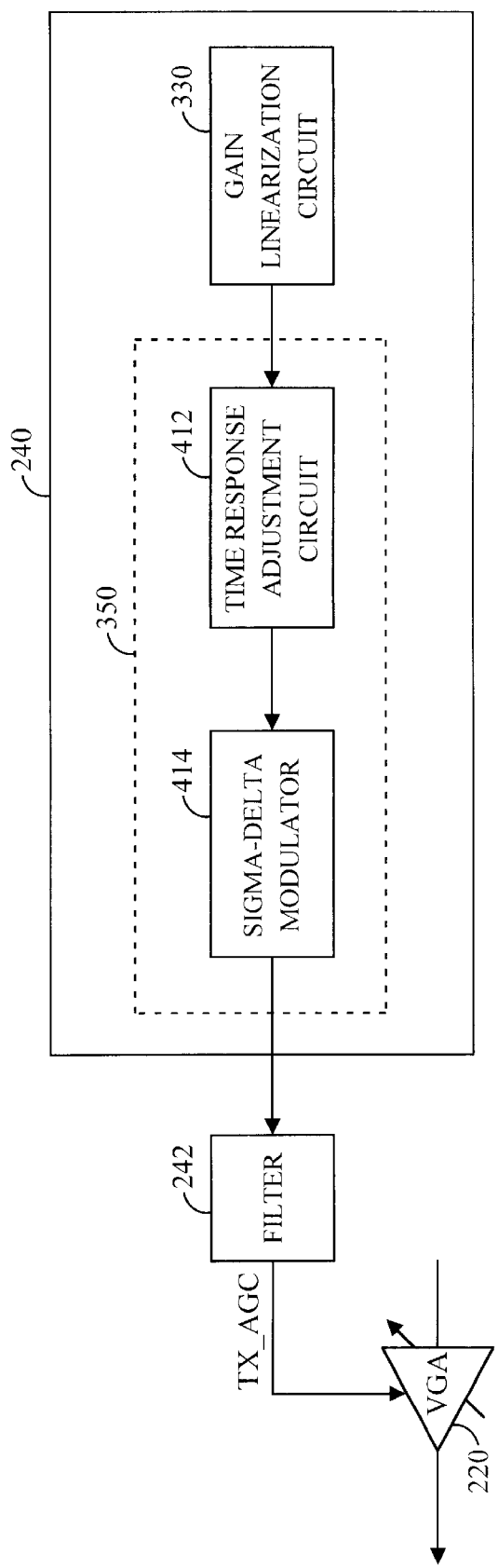
FIG. 4 shows a diagram of a portion of a gain control mechanism that includes an embodiment of an interface circuit.

FIG. 4 shows a diagram of a portion of a gain control mechanism that includes an embodiment of interface circuit 350. Interface circuit provides improved response time while maintaining (or reducing) the ripple amplitude. The compensated control signal from gain linearization circuit 330 is provided to a time response adjustment circuit 412 within interface circuit 350. Circuit 412 generates an "adjusted" control signal having an adjusted time response, as will be described below. The adjusted signal is provided to a sigma-delta modulator 414 that generates a modulator signal. The modulator signal comprises a sequence of waveforms corresponding to the values in the adjusted control signal. Filter 242 receives and filters the modulator signal to provide the VGA control signal TX_AGC.

Figure 5:
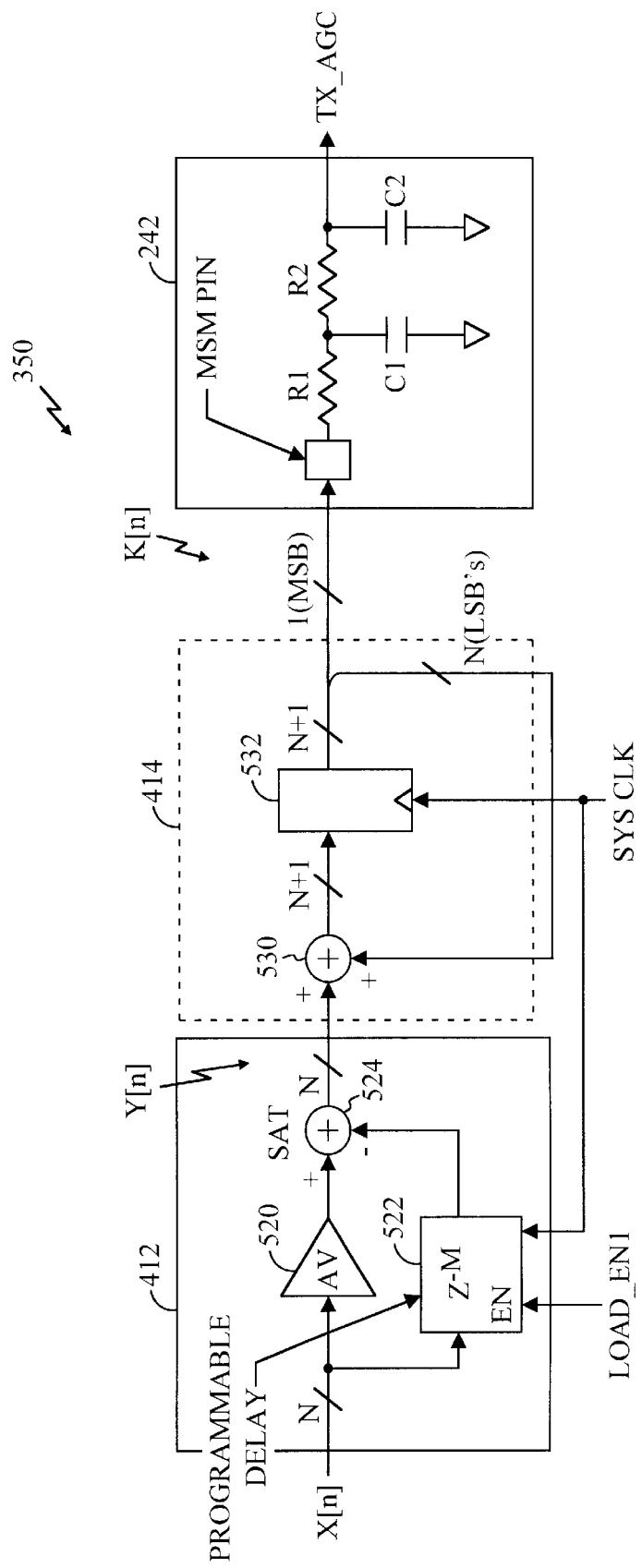
FIG. 5 shows a diagram of a specific embodiment of the interface circuit.

FIG. 5 shows a diagram of a specific embodiment of an interface circuit 350. Interface circuit 350 includes time response adjustment circuit 412 and first order sigma-delta modulator 414. The compensated control signal x[n] is provided to time response adjustment circuit 412 that generates the adjusted control signal y[n]. In an embodiment, the adjusted control signal includes modifications to the compensated control signal that provides a faster or modified response time.

Within time response adjustment circuit 412, the signal x[n] is provided to a gain element 520 and a delay element 522. Gain element 520 scales the signal x[n] by a scaling factor (Av) that can be fixed or programmable. In a specific embodiment, the scaling factor is two. Delay element 522 delays the signal x[n] by a time period that can also be fixed or programmable. The scaling factor and the amount of delay are dependent on the requirements of the particular application in which interface circuit 350 is used. The scaled signal from gain element 520 and the delayed signal from delay element 522 are provided to a summer 524 that subtracts the delayed signal from the scaled signal. In an embodiment, summer 524 is a saturation summer that limits the output to N-bit values, which fall within the input range of the subsequent sigma-delta modulator 414. The signal y[n] from summer 524 is provided to sigma-delta modulator 414.

Within sigma-delta modulator 414, the signal y[n] is provided to a summer 530 that adds the signal y[n] with the N least significant bits (LSBs) from a register 532. The (N+1)-bit output from summer 530 is provided to and stored by register 532. The most significant bit (MSB) from register 532 comprises the quantized modulator signal k[n] that is provided to filter 242. As shown in the specific embodiment in FIG. 5, both delay element 522 and register 532 are clocked by the same clock signal (SYS CLK), although this is not a necessary condition.

Filter 242 filters the modulator signal from modulator 414 to generate the analog control signal TX_AGC. In the specific embodiment shown in FIG. 5, filter 242 is a second order lowpass filter comprising two resistors and two capacitors.

To improve the response time of the control signal TX_AGC, time response adjustment circuit 412 is programmed to generate overdrive pulses that assist the response of filter 242. For example, when the gain of gain element 520 is set at two (Av=2), circuit 412 generates an overdrive pulse having an amplitude equaled to the change in the signal x[n]. The amplitude of the overdrive pulse may be smaller in some instances, depending on the value of x[n] and the magnitude of the change in x[n]. Each overdrive pulse has a duration of $M \cdot T_s$ that is determined by the delay element.

Sigma-delta modulator 414 provides a modulator signal k[n] comprising a sequence of high and low values (i.e., a sequence of output waveforms) corresponding to the adjusted control signal y[n] at its input. Sigma-delta modulator 414 uniformly distributes the spacing between the high values in the output waveforms to provide improved steady state ripple performance over that of conventional pulse width modulators (PWMs) as well as conventional PDMs. This characteristic results in smaller ripple amplitude because the capacitors in filter 242 have approximately the same amount of time to charge and discharge each set of high and low values. Analysis indicates that sigma-delta modulator 414, with nine bits of resolution (N=9), can reduce the worse case peak-to-peak ripple amplitude by a factor of three or more. This improvement in ripple amplitude can be traded for faster response time. Specifically, by increasing the bandwidth of the lowpass filter by a factor of three, a three times improvement in response time is achieved for the same ripple amplitude.

A single order lowpass filter is typically used to filter the modulator signal k[n] from the modulator. The single order filter can be implemented with a single resistor and a single capacitor. Although the single order filter results in a low component count, the response time and ripple performance are not satisfactory for some applications.

For a second order filter having two poles, the frequency response of the filter falls off as 1/f between the frequencies of the first and second poles, and as $1/f^2$ after the frequency of the second pole. By selecting the frequencies of the two poles to be lower than the ripple components (i.e., $f_{p1}$ and $f_{p2} < f_{ripple}$), the ripple is attenuated by 40 dB/decade slope, which is faster than a slope of 20 dB/decade achieved with a first order filter. The improvement in ripple can then be traded for improvement in the response time of the filter. Stated differently, to meet a particular ripple requirement, the poles of the second order filter can be increased higher than that of the single order filter, thereby resulting in a faster response time without sacrificing ripple performance.

The ripple performance is a function of the type of modulator (e.g., conventional PDMs, sigma-delta modulator, and so on), the bandwidth of the lowpass filter, and also the speed of the modulator clock. It can be shown that speeding up the clock frequency of the sigma-delta modulator results in a corresponding reduction in the amount of ripple. The improvement in ripple performance can then be traded for faster response time, by increasing the bandwidth of the analog filter.

The implementation and operation of circuit 412, sigma-delta modulator 414, and filter 242 are described in further detail in the related patent application Ser. No. 19622-2.

Integrated Gain Control Mechanism for the Transmit Chain

With circuitry providing fast response time for controlling the VGA gain, the gain control mechanism for driver 226 and PA 228 can be integrated with the gain control mechanism for VGA 220. In an implementation, the gains for driver 226 and PA 228 can be controlled by the control signals PA_R0 and PA_R1 in the nominal manner. As the gain of either driver 226 or PA 228, or both, is changed, a gain offset value corresponding to the change in the driver-PA gain is digitally subtracted from the VGA control signal. The overall VGA control signal is then filtered and provided to VGA 220.

In the embodiment shown in FIG. 2, driver 226 includes two gain settings and PA 228 includes three gain settings. These gain settings can be combined to form three to six driver-PA gain settings. In a specific embodiment, these elements are combined to form four gain settings as defined by Table 1.

TABLE 1

Gain States for Driver and PA

| Driver-PA Gain State | Output Transmit Power Range | Driver Gain Setting | PA Gain Setting | Driver-PA Gain |
|---|---|---|---|---|
| 0 | −52 dBm to −17 dBm | low gain | bypassed | 0 dB |
| 1 | −32 dBm to +3 dBm | high gain | bypassed | 20 dB |
| 2 | −14 dBm to +21 dBm | high gain | low gain | 38 dB |
| 3 | +5 dBm to +28 dBm | high gain | high gain | 56 dB |

As the driver-PA gain is changed, the gain of VGA 220 is offset accordingly to account for the change in driver-PA gain to maintain approximately the same transmit power level before and after the driver-PA gain change. For example, when the driver-PA gain is changed from gain state 1 to gain state 2, the driver-PA gain is increased by approximately 18 dB. Thus, a gain offset value that decreases the gain of the VGA by 18 dB is added to the VGA control signal. At approximately the time that the gain of the driver-PA is changed, the VGA gain is adjusted such that the transient in the output transmit power is minimized.

Figure 6:
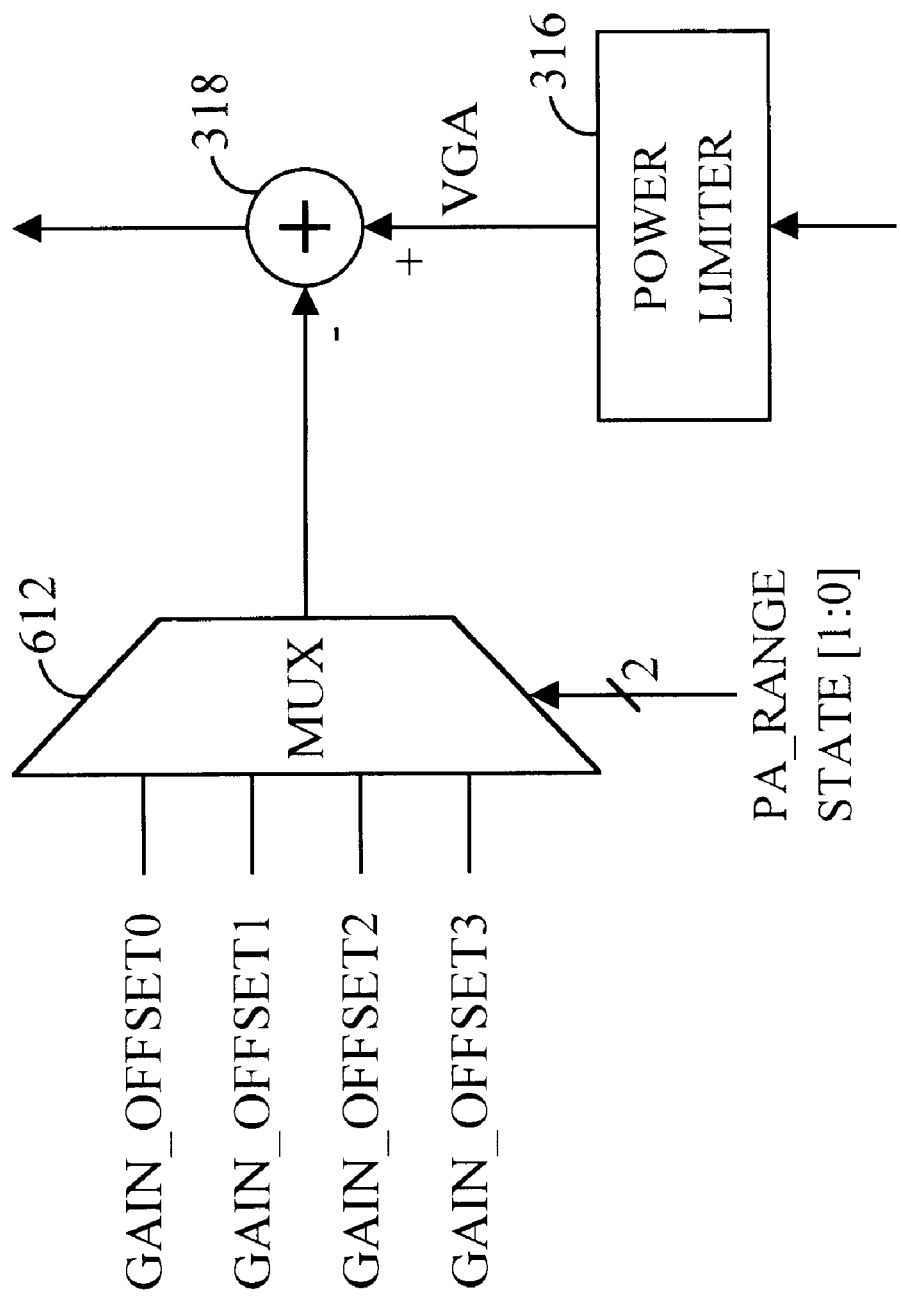
FIG. 6 shows a block diagram of an embodiment of a gain offset circuit.

FIG. 6 shows a block diagram of an embodiment of a gain offset circuit. Four gain offset values are provided to a multiplexer (MUX) 612, one gain offset signal corresponding to each of the driver-PA gain state. These gain offset values can be stored in a memory (e.g., a RAM, a ROM, a FLASH memory, or other memory technologies), a set of registers, a controller, or other circuits. MUX 612 also receives the control signal PA_RANGE_STATE[1:0] that selects one of the gain offset values to provide to summer 318. Summer 318 then subtracts the selected gain offset value from the VGA gain value to provide the overall VGA gain value.

With four gain states for the driver and PA, only three gain offset values (from a nominal gain value) are needed. The complexity of MUX 612 can thus be reduced. However, the implementation with four gain offset values, one for each of the driver-PA gain states, allows for greater flexibility in the transmitter design and also avoids saturation of the data paths.

As indicated above, for CDMA communications systems, the control signals for driver 226 and PA 228 are typically generated using one update clock and the control signal for VGA 220 is generated using another update clock. These two clocks are typically frequency locked, but are generally not phase locked. The difference in the phases of the two clocks is especially problematic for the transmit gain control mechanism because of the need to align the control signals for the driver-PA and VGA to reduce transient in the output transmit power.

In IS-95-A compliant CDMA communications systems, data transmissions from a subscriber unit to a base station occurs through transmissions of Walsh symbols. Within the subscriber unit, data bits are generated, encoded, and grouped to groups of six coded data bits. Each group is used to index a table of Walsh symbols. Each Walsh symbol is a sequence of 64 bits and has duration of 208 $\mu$sec, resulting in a Walsh symbol rate of 4.8 kHz. The Walsh symbols are modulated and transmitted to the base station. At the base station, the transmitted signal is received and demodulated. Conventionally, coherently demodulation is performed over each Walsh symbol period and non-coherently demodulation is performed over multiple Walsh symbols. For coherent demodulation, the phase information of the received signal has a large impact on the demodulation performance.

In a specific implementation, since switching of the gain of the driver or the PA tends to generate transient phase fluctuations and discontinuities in the output transmit signal, the switching of the driver and PA is limited to boundaries of the Walsh symbols to minimize performance degradation. By aligning the switching of the gains of the driver and PA to Walsh symbol boundaries, the transients in the output transmit power occur at the symbol boundaries and degradation in system performance is reduced. This design choice results in the driver and PA being switched at the 4.8 kHz Walsh symbol rate.

The 4.8 kHz update rate is generally adequate for switching between gain states but is typically inadequate for the VGA gain control. A faster update rate is typically needed to allow the VGA to quickly adjust the output transmit power level in response to rapid changes in the operating conditions. In a specific implementation, the update rate of the VGA is 38.4 kHz. In a specific implementation, the update clock for the driver-PA gain setting circuit is a 4.8 kHz clock derived from a modulator in the transmit section of the subscriber unit, and the update clock for the VGA gain setting circuit is a 38.4 kHz clock derived from a demodulator in the receive section of the subscriber unit.

For IS-95-A compliant communications systems, a requirement of 1.0 $\mu$sec is imposed on the timing delay between a receive frame boundary and a transmit frame boundary. This delay is typically shorter than the processing delay of the subscriber unit. Thus, some of the processing in the transmitter is performed in advance, before receipt of the received frame. The transmitter timing is dynamic relative to the receiver timing, resulting in asynchronous timing between the transmitter and receiver. This results in asynchronous timing between the driver-PA control signals derived from the transmitter timing and the VGA control signal derived from the receiver timing.

To provide an integrated gain control mechanism, the timing of the control signals for the driver-PA and VGA are synchronized, when necessary (i.e., when the driver-PA changes gain state) as described below.

Figure 7A:
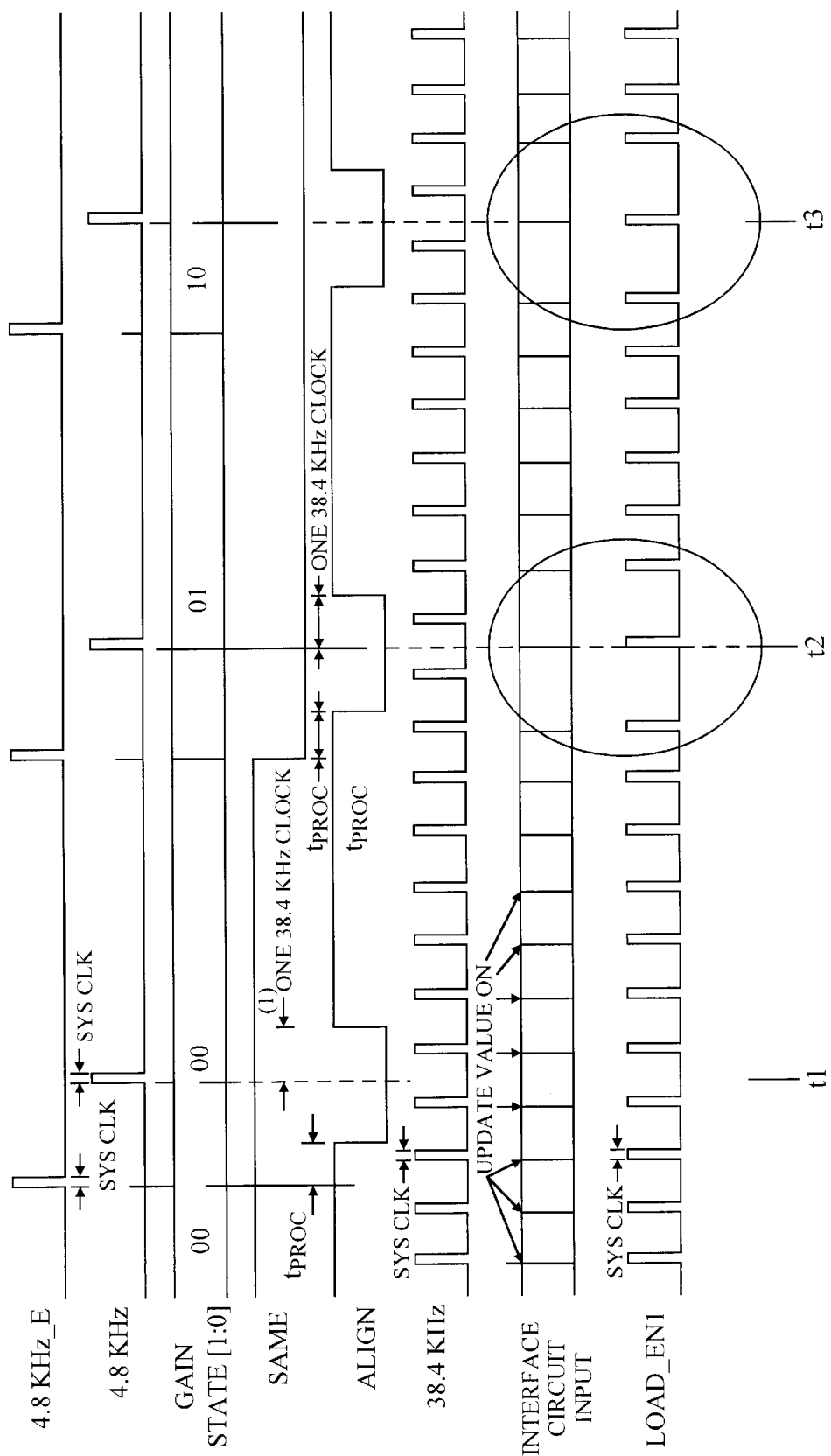
FIG. 7A is a timing diagram the control signals for the driver-PA and VGA.

FIG. 7A is a timing diagram illustrating the control signals for the driver-PA and VGA. It can be noted that the 4.8 kHz update clock for the driver-PA is not aligned with the 38.4 kHz update clock for the VGA. At time $t_1$, the current and previous gain states are the same (e.g., both are at gain state 00), and the input of interface circuit 350 is updated with a control value in the nominal manner with the 38.4 kHz clock. At time $t_2$, the current and previous gain states are not the same (e.g., changed from gain state 00 to gain state 01), and the input of interface circuit 350 is updated with a control value using the 4.8 kHz clock. Intermediate control signals SAME and ALIGN are generated to assist in aligning the VGA control values to the proper update clock. In an embodiment, if the SAME control signal is low, indicating the change in driver-PA state, the ALIGN control signal prevents an update of interface circuit 350 for one 38.4 kHz clock period before and after the leading edge of the 4.8 kHz. This ensures that interface circuit 350 does not generate a large under-drive or over-drive control signal for the VGA in response to a change in gain state, and that the PDM filter has adequate time to filter the large gain step. If the SAME control signal is high, indicating no change in the driver-PA state, the input of interface circuit 350 is updated in the normal manner. The control signals SAME and ALIGN are generated based on an "early" version of the 4.8 kHz clock (labeled as 4.8 kHz_E) shown at the top of FIG. 7A. The control signal LOAD_EN1 shown at the bottom of FIG. 7A illustrates the update time of the input of interface circuit 350.

Figure 7B:
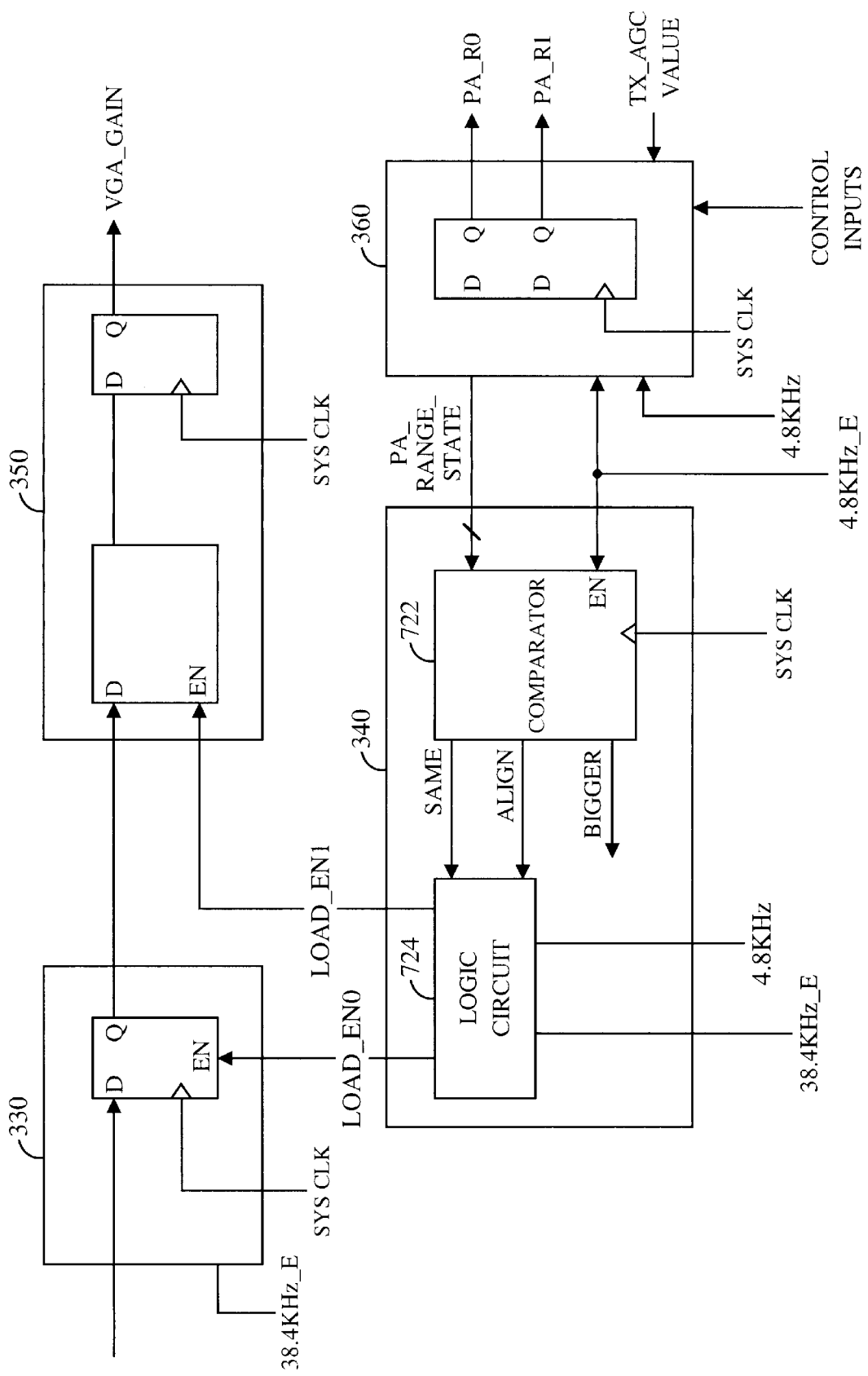
FIG. 7B shows a block diagram of an embodiment for generating the control signals for the driver-PA and VGA.

FIG. 7B shows a block diagram of an embodiment for generating the control signals for the driver-PA and VGA. The gain state is determined by PA_RANGE control circuit 360 (i.e., based on the control inputs and the TX_AGC value) and provided to a comparator 722 within timing synchronization circuit 340. Comparator also receives the clock signal SYS CLK and the 4.8 kHz_E clock, compares the current gain state to the previous driver-PA gain state, and generates the SAME and ALIGN control signals that indicate whether a change in driver-PA gain state has or has not occurred. The SAME and ALIGN control signals are provided to a logic circuit 724 that generates load enable signals for gain linearization circuit 330 and interface circuit 350. The load enable signal LOAD_EN0 is used to latch the output of gain linearization circuit 330 (which is the input to interface circuit 350) and the load enable signal LOAD_EN1 is used to enable delay element 522 within interface circuit 350. The signals LOAD_EN0 and LOAD_EN1 ensure that the inputs to interface circuit 350 and delay element 522 within interface circuit 350 are updated/enabled at the same time. As shown in FIG. 7A, the load enable signal LOAD_EN1 include enable pulses that are aligned to the 38.4 kHz clock during normal operation and to the 4.8 kHz clock when a change in driver-PA gain state occur. The VGA_GAIN output from interface circuit 350 and the PA_R0, PA_R1, and PA_ON outputs from control circuit 360 are latched by the system clock SYS CLK (or clocks having similar phases) to align the phases of these control signals.

Figure 7C:
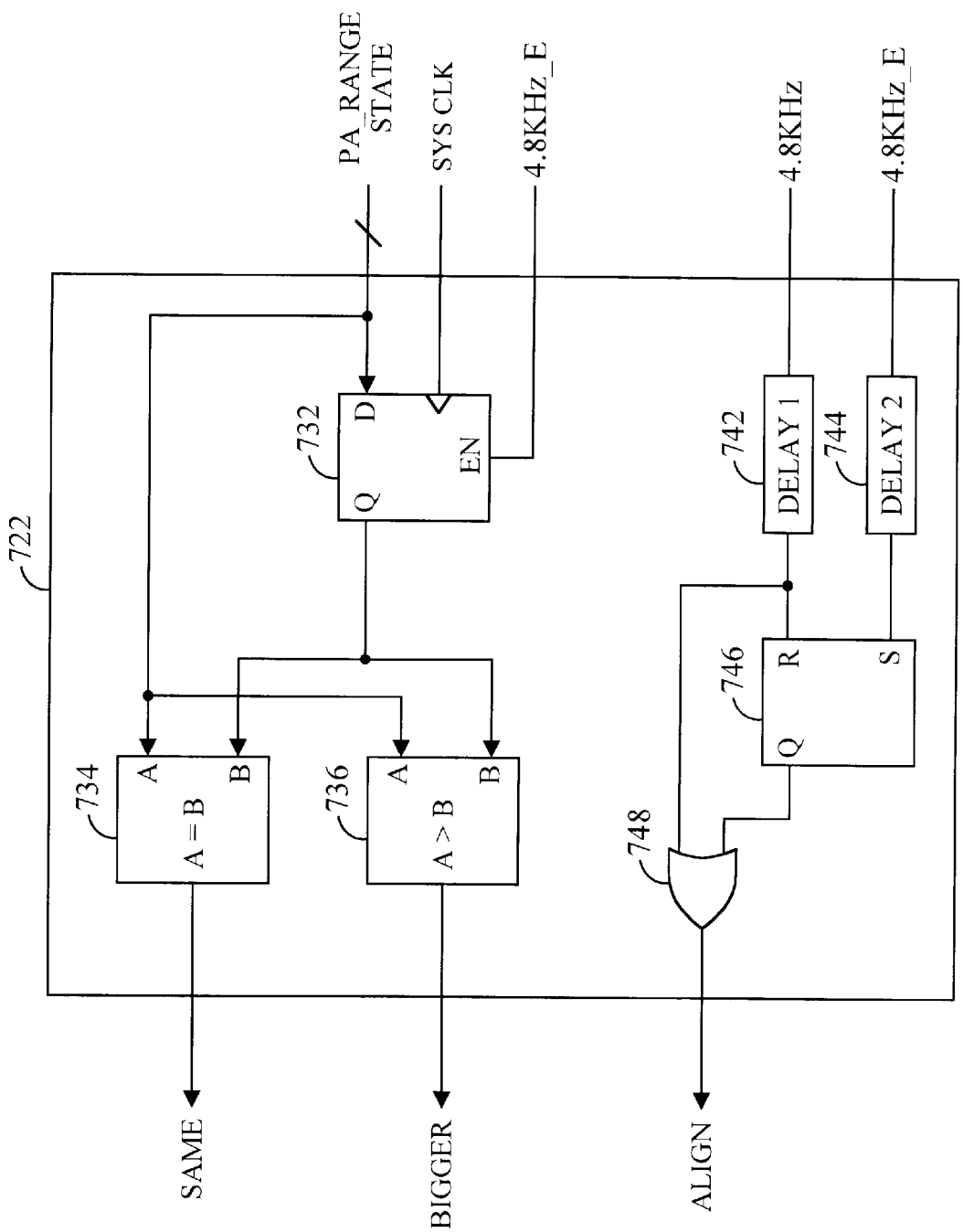
FIGS. 7C and 7D show diagrams of an embodiment of a comparator and a logic circuit, respectively, within a timing synchronization circuit.

FIG. 7C shows a diagram of an embodiment of comparator 722. Within comparator 722, the PA_RANGE_STATE signal is provided to the data input of a register 732 and the A inputs of comparators 734 and 736. Register 732 is clocked with the clock signal SYS CLK but enabled with the 4.8 kHz_E clock, and the output from register 732 is provided to the B inputs of comparators 734 and 736. Register 732 holds the previous driver-PA gain state value. Comparators 734 and 736 each compares the values of the A (i.e., the current driver-PA gain state) and B (i.e., the previous driver-PA gain state) inputs. Comparators 734 and 736 then generates the SAME and BIGGER control signals, respectively.

The 4.8 kHz clock and the 4.8 kHz_E clock are provided to delay elements 742 and 744, respectively. Delay element 742 provides a delay of one cycle of the 38.4 kHz clock and delay element 744 provides a delay ($t_{PROC}$) to account for the processing delay in the computation of the VGA control value (i.e., including the processing delay of gain linearization circuit 330). The delay between the 4.8 kHz clock and the 4.8 kHz_E clock is two 38.4 kHz clock periods, which is enough time for the VGA gain linearizer block to get updated with the proper driver-PA offset (with maximum processing delay through the TX_AGC block) so that both VGA and driver-PA gains will be ready at a particular time (e.g., Walsh symbol boundary). This delay between the 4.8 kHz clock and the 4.8 kHz_E clock can be generate because the 4.8 kHz clock and 38.4 kHz clock are frequency locked (i.e., derived from a common system clock) even though they are not phased lock (i.e., derived using different mechanisms). The delayed clocks from delay elements 742 and 744 are provided to the R and S inputs, respectively, of a latch 746. The output of latch 746 is provided to one input of an OR gate 748 and the delay 4.8 kHz clock from delay element 742 is provided to the other input of OR gate 748. The output of OR gate 748 comprises the ALIGN signal.

Figure 7D:
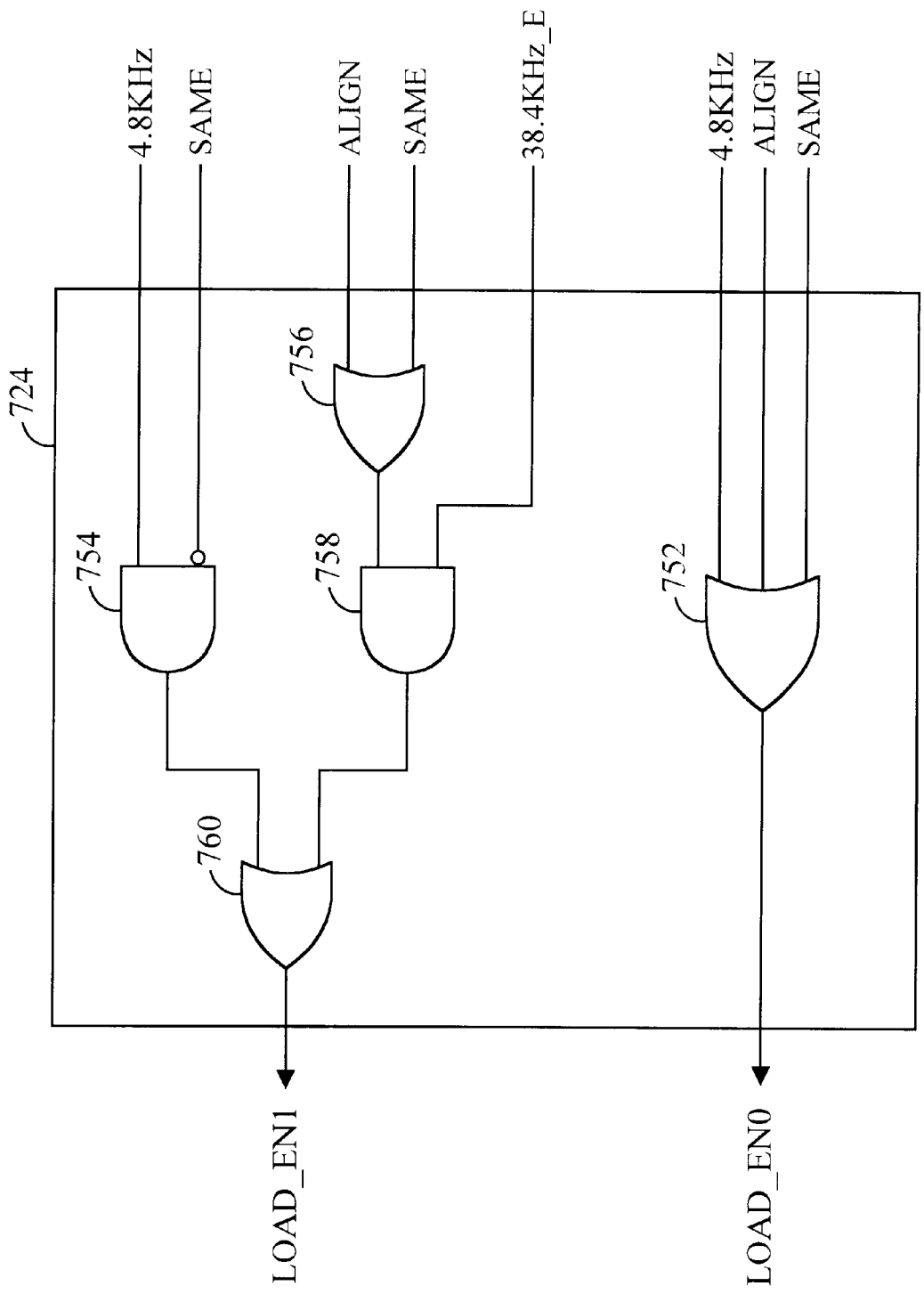

FIG. 7D shows a diagram of an embodiment of logic circuit 724. Within logic circuit 724, the 4.8 kHz clock and the ALIGN and SAME signals are provided to the inputs of an OR gate 752. The output of OR gate 752 comprises the load enable signal LOAD_EN0. The 4.8 kHz clock and the SAME signal are provided to a non-inverting input and an inverting input of an AND gate 754, respectively. The ALIGN and SAME signal are provided to the inputs of an OR gate 754, respectively. The early 38.4 kHz clock and the output of OR gate 756 are provided to the inputs of an AND gate 758. The outputs of AND gates 754 and 756 are provided to the inputs of an OR gate 760. The output of OR gate 760 comprises the load enable signal LOAD_EN1.

Distributed Dynamic Range for the Transmit Chain

With the integrated gain control mechanism, the dynamic range requirement of the transmitter can be distributed across the various gain elements in the transmit chain. In a specific embodiment of transmitter 200 in FIG. 2, driver 226 and PA 228 provide approximately 55 dB of the required dynamic range and VGA 220 provides the remaining 30 dB of the required dynamic range. Different distributions of the required dynamic range are possible and are within the scope of the invention.

Figure 8A:
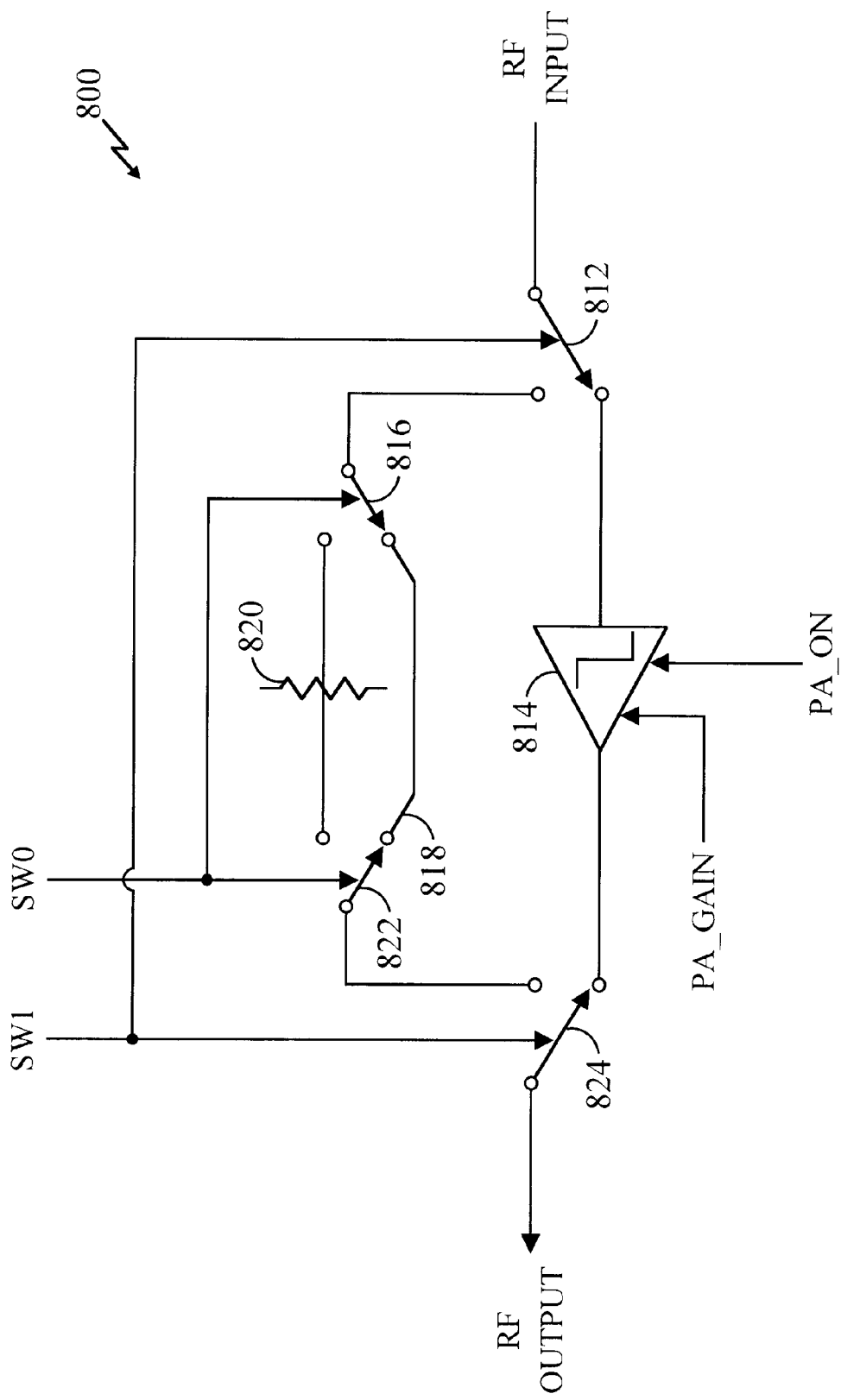
FIGS. 8A and 8B show diagrams of an embodiment of a high efficiency power amplifier (HEPA) and a power amplifier circuit, respectively, having multiple gain settings and a bypass setting.

FIG. 8A shows a diagram of an embodiment of a high efficiency power amplifier (HEPA) 800 having multiple gain settings and a bypass setting. HEPA 800 can replace the combination of driver 226 and PA 228 in FIG. 2. Within HEPA 800, the RF signal is provided to an input of a switch 812. One output of switch 812 couples to an input of an amplifier 814 and the other output of switch 812 couples to an input of a switch 816. One output of switch 816 couples to one end of a bypass path 818 and the other output of switch 816 couples to one end of an attenuator 820. The other ends of attenuator 820 and bypass path 818 couple to two inputs of a switch 822. The output of switch 822 and the output of amplifier 814 couple to two inputs of a switch 824. The output of switch 824 comprises the RF output of HEPA 800. In the specific embodiment shown in FIG. 8A, amplifier 814 includes a low gain state and a high gain state.

Switches 816 and 822 are controlled by a control signal SW0 and switches 812 and 824 are controlled by another control signal SW1. The gain of amplifier 814 is controlled by a control signal PA_GAIN. Amplifier 814 can also be powered on or off by a control signal PA_ON. Control signals SW0, SW1, and PA_GAIN can be generated by PA control circuit 232 (see FIG. 2) from the two control signals PA_R0 and PA_R1.

TABLE 2

Gain Settings for HEPA

| HEPA Gain State | Output Transmit Power Range | Attenuator Setting | Amplifier Setting | HEPA Gain |
|---|---|---|---|---|
| 0 | −52 dBm to −17 dBm | ON | bypassed | 0 dB |
| 1 | −32 dBm to +3 dBm | bypassed | bypassed | 20 dB |
| 2 | −14 dBm to +21 dBm | bypassed | low gain | 38 dB |
| 3 | +5 dBm to +28 dBm | bypassed | high gain | 56 dB |

HEPA 800 provides several advantages. First, HEPA 800 provides a portion of the required dynamic range for the transmit path, thereby reducing the dynamic range requirement of the VGA. With a lower dynamic range requirement, the VGA can be designed to consume less power and occupy less die area. Typically, high dynamic range is achieved by biasing the amplifier with large amounts of current or providing multiple gain stages, or both. By reducing the dynamic range requirement, the bias current can be reduced, or one or more amplifier stages can be eliminated.

Reducing the dynamic range requirement of the VGA also allows for further improvements in the transmitter architecture. Referring to FIG. 2, the IF signal into VGA 220 is upconverted from baseband to the IF frequency by a previous upconversion stage that is not shown in FIG. 2. This IF signal is then upconverted to RF by a second upconversion stage implemented with mixer 222. In some transmitter designs, it is advantageous to directly upconvert the baseband signal to RF frequency with a single direct upconversion stage. The direct upconversion architecture may reduce the complexity of the transmitter circuitry, which may lead to reduced circuit size and cost. The direct upconversion architecture may also provide improved performance. For the direct upconversion architecture, the VGA is implemented at the RF frequency. Designing a VGA at the RF frequency that can provide the entire dynamic range requirement (e.g., 85 dB) may be extremely difficult. Thus, the direct upconversion architecture may be premised on the reduction in the dynamic range requirement of the VGA.

Figure 8B:
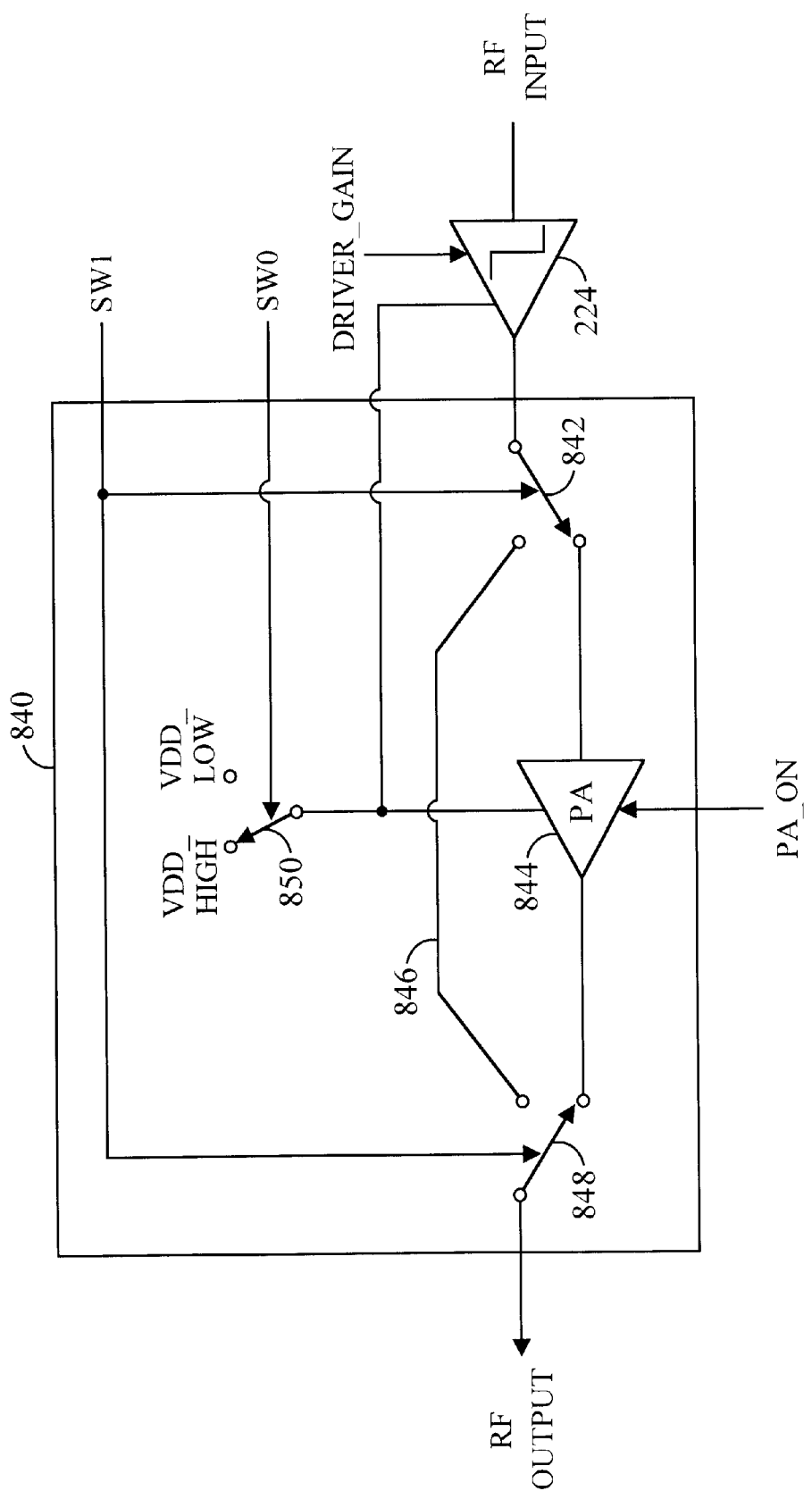

FIG. 8B shows a diagram of an embodiment of a power amplifier circuit 840 also having multiple gain settings and a bypass setting. PA circuit 840 replaces PA 228 in FIG. 2. Within PA circuit 840, the RF signal from driver 226 is provided to an input of a switch 842. One output of switch 842 couples to the input of a PA 844 and the other output of switch 842 couples to one end of a bypass path 846. The other end of bypass path 846 couples to one input of a switch 848, and the output of PA 844 couples to the other input of switch 848. The output of switch 848 comprises the RF output of PA circuit 840. PA circuit 840 and driver 226 combine to provide up to four gain settings.

Switches 842 and 848 are controlled by a control signal SW1 and the bias of PA 844 is controlled by another control signal SW0 through a switch 850. Control signals SW0 and SW1 can be generated by PA control circuit 232 (see FIG. 2) from the two control signals PA_R0 and PA_R1.

Figure 8C:
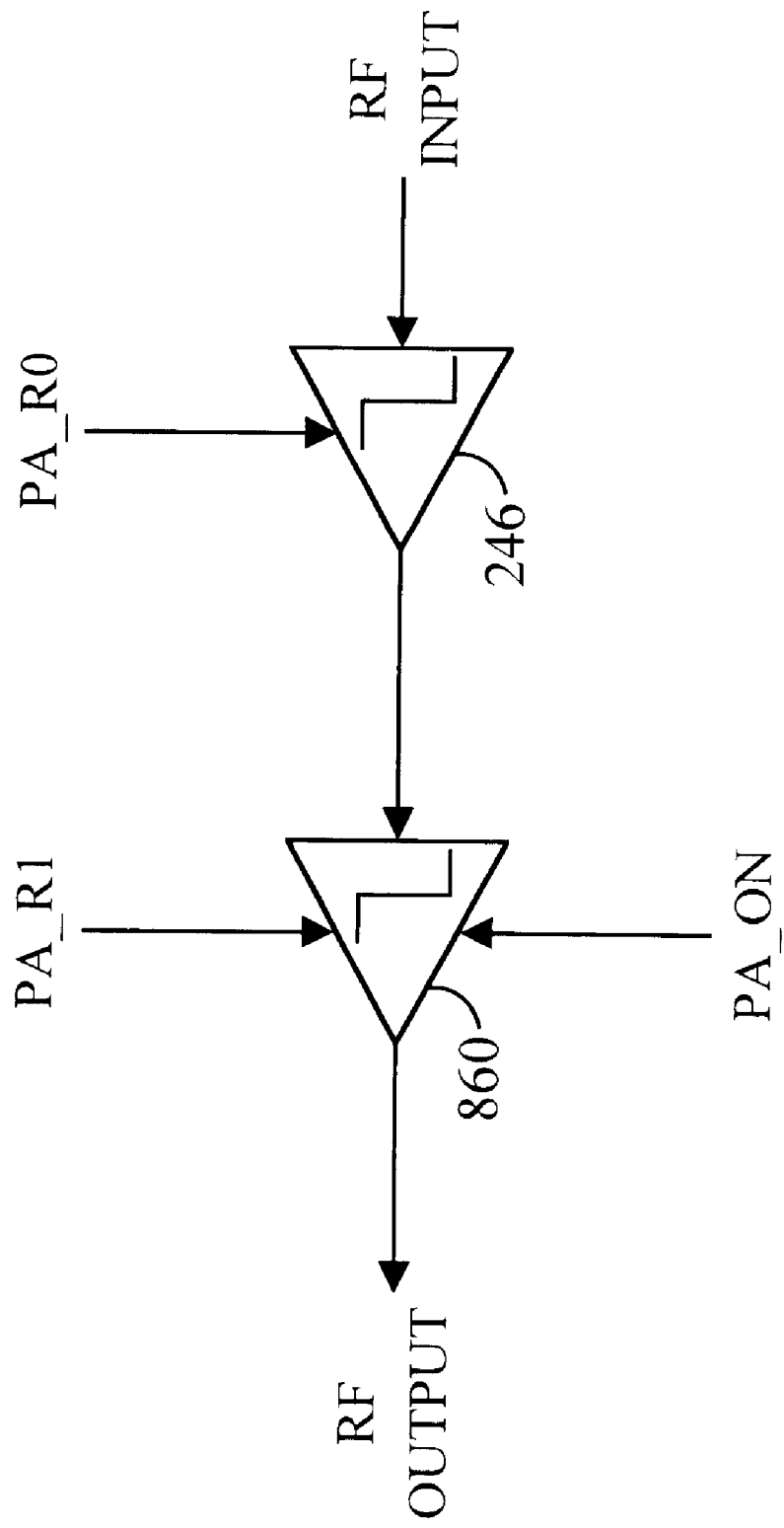
FIG. 8C shows a diagram of an embodiment of a PA having multiple gain settings but no bypass setting.

FIG. 8C shows a diagram of an embodiment of a PA 860 having multiple gain settings but no bypass setting. PA 860 replaces PA 228 in FIG. 2. PA 860 and driver 246 can combine to provide up to four gain settings. This implementation can be less complex than that of FIGS. 8A and 8B, and may be preferable in some applications. The control signals PA_R0 and PA_R1 can be generated by controller 240 in FIG. 2.

Linearization of the Transmit Power

In CDMA communications systems, the transmit power level of a subscriber unit (e.g., the cellular telephone) is adjusted during a communication with a base station. On the reverse link, each transmitting subscriber unit acts as an interference to other subscriber units in the network. The reverse link capacity is limited by the total interference that a subscriber unit experiences from other transmitting subscriber units within the cell.

To minimize interference and maximize the reverse link capacity, the transmit power of each subscriber unit is controlled by two power control loops. The first power control loop adjusts the transmit power of the subscriber unit such that the signal quality, as measured by the energy-per-bit-to-noise-plus-interference ratio $E_b/(N_o+I_o)$, of the signal received at the base station is maintained at a constant level. This level is referred to as the $E_b/(N_o+I_o)$ set point. The second power control loop adjusts the set point such that the desired level of performance, as measured by the frame-error-rate (FER), is maintained. The first power control loop is often referred to as the reverse link closed power control loop and the second power control loop is often referred to as the reverse link outer power control loop. The power control mechanism for the reverse link is disclosed in detail in U.S. Pat. No. 5,056,109, entitled "Method and Apparatus for Controlling Transmission Power in a CDMA Cellular Mobile Telephone System," assigned to the assignee of the present invention, and incorporated by reference herein.

In the reverse link closed power control loop, the base station measures the received $E_b/(N_o+I_o)$ from each subscriber unit and compares the measured value to a threshold value. If the measured $E_b/(N_o+I_o)$ is below the threshold, the base station sends a one-bit command (also referred to as a power control bit) to the subscriber unit directing it to increase its transmit power by a particular amount (e.g., 1 dB for IS-95-A compliant CDMA communications systems). Alternatively, if the measured $E_b/(N_o+I_o)$ is above the threshold, the base station sends a one-bit command to the subscriber unit directing it to decrease its transmit power by the particular amount (again 1 dB for IS-95-A compliant systems). Upon receipt of this one-bit command, the close loop power control mechanism of the subscriber unit adjusts its output transmit power level up or down accordingly.

TIA/EIA/IS-95-B requires the mean output transmit power from the subscriber unit, following the receipt of a valid power control bit, to be within ±0.5 dB of the final value for 1 dB step within one power control group. An accurate gain setting mechanism is needed to meet this specification. Also, since each transmitting subscriber unit creates interference for other subscriber units, accurate control of the output transmit power level is advantageous for improved system performance and increased system capacity.

Figure 9A:
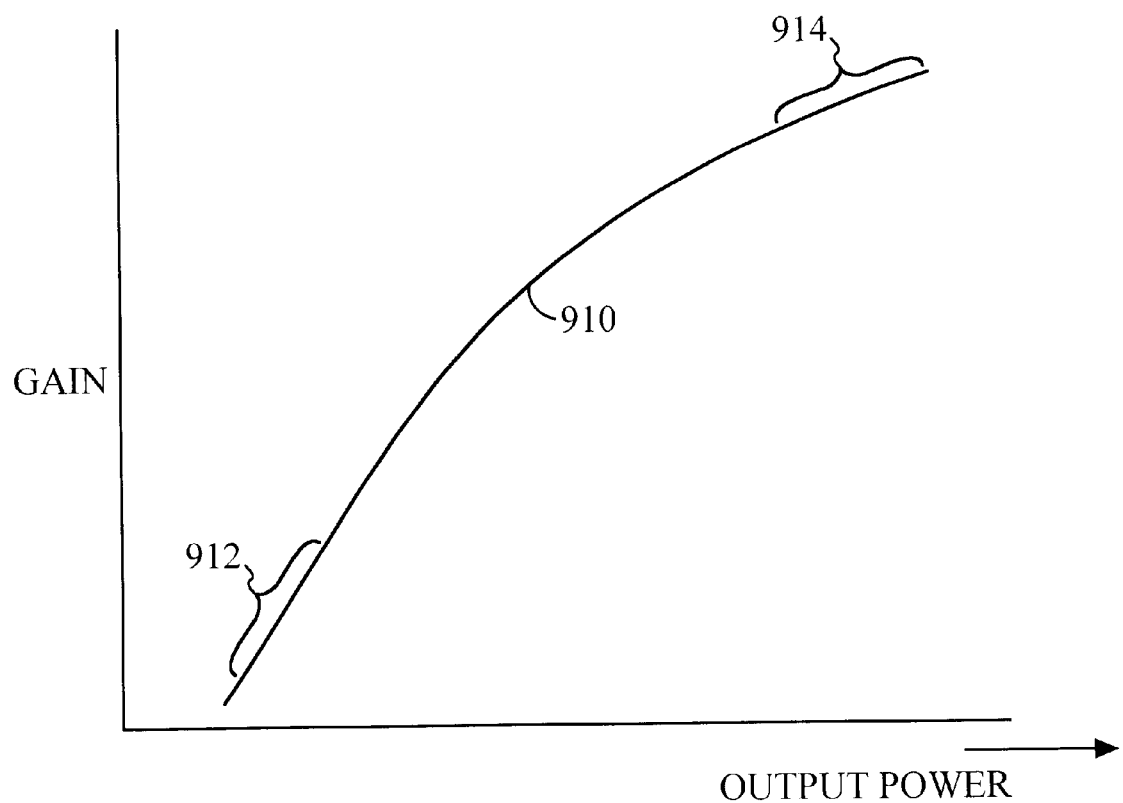
FIG. 9A shows a plot of a gain transfer function (or curve) of a representative circuit element such as a VGA, driver, or PA.

FIG. 9A shows a plot of a gain transfer function (or curve) 910 of a representative circuit element (e.g., VGA, driver, or PA). At low output power levels around a region 912, the circuit element tends to have linear gain. If the circuit element is class AB, at midpoint power levels around region 910, the circuit element tends to provide (relatively) higher gain. At high output power levels around a region 914, the gain of the circuit element is reduced. The gain of the circuit element can thus be expanded at mid output power levels and compressed at higher output power levels. A gain linearization mechanism is used to allow for linear control of the output transmit power (i.e., linear control in 1 dB increments as required by IS-95-A specifications).

One implementation of the gain linearization mechanism is through the use of a gain calibration table. To linearize a particular circuit element, a gain transfer curve is first measured for that circuit element. A gain calibration table is then generated based on the measured gain transfer curve. The gain calibration table contains a calibration curve that is the inverse of the measured gain transfer curve. The combination of the calibration curve and the gain transfer curve is approximately linear. The gain calibration table provides output gain control values that set the gain element such that the gain varies linearly with the input into the calibration table.

The output transmit power is a function of all elements in the transmit signal path. To allow for linear control of the output transmit power, the gain calibration table is typically generated with, and takes into account, the nonlinearities of all elements in the transmit signal path.

Figure 9B:
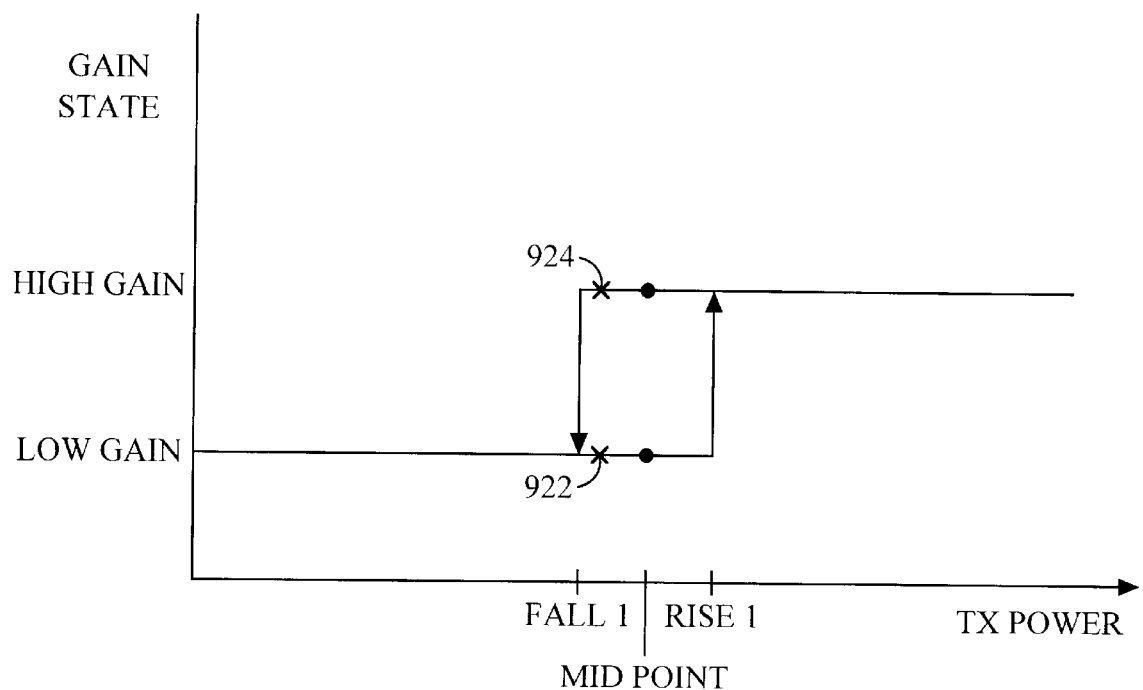
FIGS. 9B and 9C are plots that show power hysteresis and power and timing hysteresis, respectively, for a circuit element having two gain states.

FIG. 9B is a plot that shows power hysteresis for a circuit element (e.g., driver 226 shown in FIG. 2) having two gain states. Power hysteresis is typically provided to prevent rapid toggling between gain settings. For example, the driver may be switched from a low gain setting to a high gain setting when the output transmit power level exceeds a rise threshold (e.g., −4 dBm), but not switched back to the low gain setting unless the output transmit power level falls below a fall threshold (e.g., −8 dBm). While the output transmit power level is between the rise and fall thresholds (e.g., between −4 dBm and −8 dBm), the gain of the driver is not changed. The range between the rise and fall thresholds comprises the power hysteresis that prevents toggling of the driver gain due to normal variations in the output transmit power level. For the transmitters shown in FIGS. 1 and 2, the driver-PA is operated at the low gain setting for low output transmit power levels and at the high gain setting for high output transmit power levels.

For simplicity, one gain calibration table is typically generated for the entire transmit signal path based on the measured gain transfer curve for the signal path. For example, to measure the gain transfer curve of the transmit signal path in FIG. 1, the driver-PA is set to one gain setting (e.g., low gain), the VGA control signal (e.g., VGA_GAIN) is stepped from low gain to high gain, and the output transmit power is measured as the VGA control signal is stepped. The measured output transmit power is used to determine the gain transfer curve of the transmit signal path. When the output transmit power level crosses the mid point between the rise and fall threshold (e.g., −6 dBm), the driver-PA is set to the other gain setting (e.g., high gain), the OS_GAIN (as shown in FIG. 1) is adjusted until the total transmit output power returns to the last value, and the process continues. The gain calibration table is then generated from the measured gain transfer curve. The calibration table "linearizes" the transmit signal path and provides control values for the VGA such that the output transmit power level varies linearly with the input value into the calibration table. The final value of OS_GAIN is recorded as fixed gain step.

With one gain calibration table to cover both driver-PA gain states, the calibration of the gain step OS_GAIN is typically performed at the mid point between the rise and fall thresholds (e.g., at −6 dBm). As shown in FIG. 9B, in the hysteresis zone between the rise and fall thresholds, the same output transmit power level can be obtained by one of two settings: (1) with the driver-PA in the low gain setting and a high VGA gain, or (2) with the driver-PA in the high gain setting and a low VGA gain. At a point 922 near the fall threshold (Fall 1), calibration is performed with the driver-PA in the low gain setting and a high VGA gain. However, during actual transmission, the transmitter can be operating in the hysteresis zone at a point 924 with a high gain setting for the driver-PA and a low VGA gain. This operating condition is not calibrated and the VGA gain at point 924 is typically extrapolated from the available data in the calibration table. However, nonlinearities due to gain expansion and compression of circuit elements in the transmit signal path (as shown in FIG. 9A) can cause deviation from the linear response. As a result, the extrapolated VGA gain (e.g., at point 924) typically deviate from the linear response. This deviation is typically more severe toward the rise and fall threshold points (i.e., away from where the gain step OS_GAIN is measured), and can exceed the required linearity (e.g., ±0.5 dB as required by IS-98-B). For example, the deviation can result in the output transmit power level exceeding one dB from the linearized output transmit power level, thus exceeding IS-98-B specifications.

Furthermore, in designs utilizing temporal hysteresis, a particular output transmit power level can be achieved at multiple gain states even beyond the power hysteresis zone between the rise and fall thresholds. This can make the deviation from a linear response more severe, and renders it impractical (or impossible) to linearize to the required linearity with only one calibration table. To better understand this phenomenon, a brief review of the idea behind timing hysteresis is provided.

In some CDMA implementations, the driver-PA gain state is switched using a slow rate clock because of system performance considerations. Further, the driver-PA gain state may be switched only after a particular time delay. For example, in one system implementation, a timer is started when a request to change to a new driver-PA gain state is detected. At the expiration of the timer, if the request to change to the new gain state persists (or if a new request is received to change to another gain state in the same gain direction as the previous request), the gain state is then changed. This delay period emulates temporal hysteresis that prevents rapid changes in gain states (i.e., toggling between gain states) due to rapid fluctuations in the operating conditions.

Figure 9C:
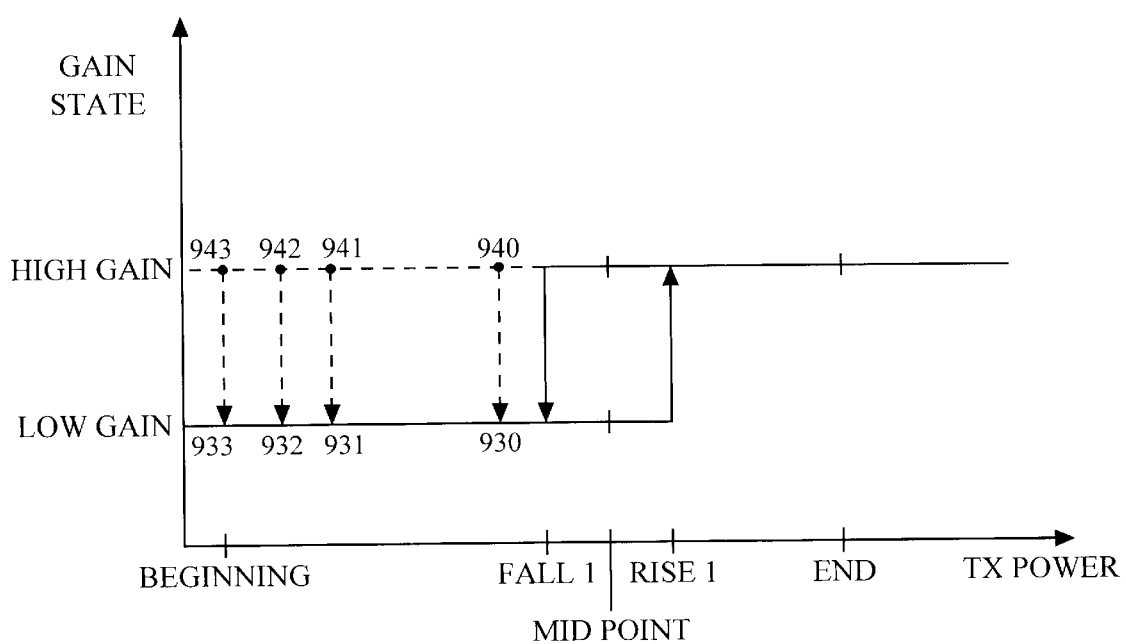

FIG. 9C is a plot that shows power hysteresis for a circuit element having two driver-PA gain states, with the addition of timing hysteresis implemented only on downward transitions (i.e., the timer is present only when going from higher to lower driver-PA gain state). Depending on the timer duration and the change in received power level, the fall threshold is effectively shifted and can potentially take any value lower than the original fall threshold, as illustrated in FIG. 9C. In this situation, the same output power can be obtained by one of two settings as previously described— one with a low driver-PA gain setting and a high VGA gain, and the other with a high driver-PA gain setting and a low VGA gain. The high driver-PA gain setting and low VGA gain can be used in the hysteresis zone between the original rise and fall thresholds and also for any required transmit output power less than the original fall threshold. For example, at points 930 through 933 in FIG. 9C, the calibration of the transmit chain is achieved with the driver-PA in the low gain setting. However, during actual transmission, the transmitter may be operating at points 940, 941, 942, or 943 due to the timing hysteresis, with the high driver-PA gain setting, a condition that has not been calibrated. The actual response will likely deviate from the desired linear response, thereby making it not possible to guarantee the linearity required by the IS-98 standard.

Figure 9D:
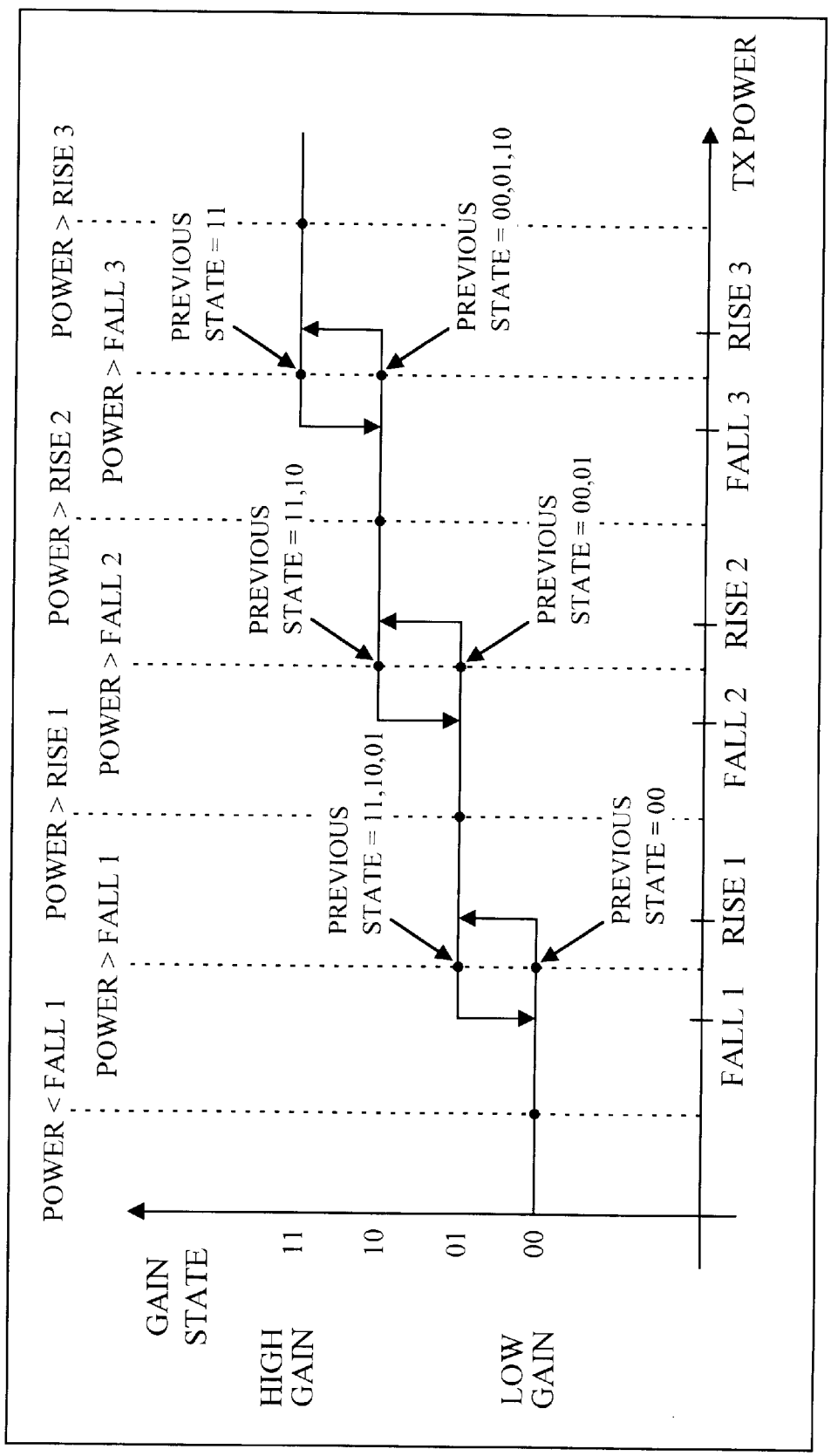
FIGS. 9D and 9E are plots that show power hysteresis and power and timing hysteresis, respectively, for a circuit element having four gain states.

FIG. 9D is a plot that shows hysteresis for a transmitter having four gain states. Each gain state is associated with rise and fall thresholds to provide power hysteresis, similar to that described above for the two gain states plot.

Figure 9E:
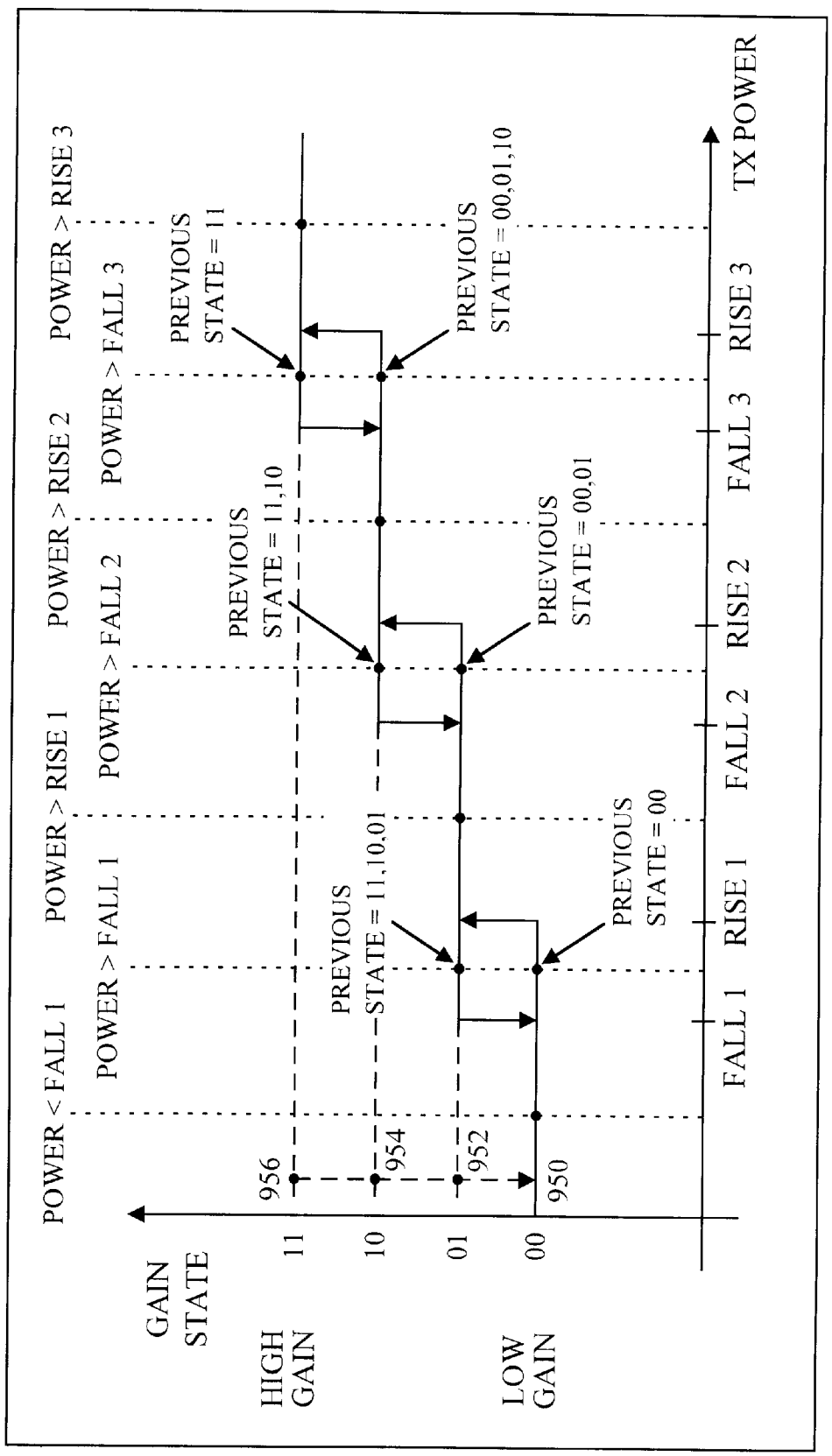

FIG. 9E illustrates the effect of adding timing hysteresis implemented only on downward transitions. As the number of gain state increases, the deviation from linear response can accumulate and become even more severe. The deviation is especially severe if a particular output transmit power level can be achieved at multiple gain states. For example, a particular output transmit power level can be achieved by the two gain states (as in the power hysteresis regions, as described in the example illustrated in FIG. 9D) as well as by all allowable gain states (as in the timing hysteresis regions, as illustrated in FIG. 9E at points 950, 952, 954, and 956).

In accordance with an aspect of the invention, multiple calibration tables are generated for the transmit signal path, one table for each gain state in the transmitter. The calibration table for each gain state is determined from a gain transfer curve measured for that gain state. The gain transfer curve is determined by setting the driver-PA to a particular gain state, stepping through the entire possible VGA gain adjustment range (e.g., the gain range of VGA 220 in FIG. 2), measuring the output transmit power level as the gain of the adjustable gain element (i.e., VGA) is varied, and then repeating the process for each driver-PA gain state.

For example, for the transmitter in FIG. 2 having four gain states, the first gain transfer curve is measured by setting the driver-PA to gain state 00, varying through the entire gain range of the VGA, and measuring the output transmit power as the VGA gain is varied. The second gain transfer curve is measured by setting the driver-PA to gain state 01, stepping through the gain range of the VGA, and measuring the output transmit power. The third and fourth curves are measured by setting the driver-PA to gain states 10 and 11, respectively, and repeating the same measurement process. These four gain transfer curves are then used to derive four separate calibration tables.

The use of a calibration table for each gain state provides several advantages. First, the output transmit power level can be accurately and linearly controlled for all gain states of the transmitter, even when the output transmit power level falls within a power hysteresis zone. Linear power control is achievable since the entire gain adjustment range of the VGA has been measured and stored for all gain states. For example, assume a transmitter design having four gain states and a VGA having a dynamic range of 85 dB. To set the output transmit power level to a particular level (e.g., −20 dBm) at any one of the four driver-PA gain states, the proper calibration table is accessed to retrieve the VGA gain control value that provides the desired output transmit power level for that particular driver-PA gain state.

The use of multiple calibration tables further allows for accurate and linear control of the output transmit power level even in the presence of timing hysteresis. The use of multiple calibration tables (e.g. one for each driver-PA range gain state) allows the transmitter to meet the above-mentioned IS-98-B specifications in the presence of timing hysteresis by calibrating the transmit chain response for each of the possible driver-PA gain states over the entire output transmit power range.

As stated above, the driver-PA is switched at an update rate (e.g., 4.8 kHz) that is slow relative to the update rate of the VGA (e.g., 38.4 kHz). During the time delay period, the output transmit power is adjusted to the proper power level by adjusting the gain of the VGA. At the expiration of the time delay period, the requested new gain state may be several states away from the current gain states. By using one calibration table for each driver-PA gain state and allowing each gain state to be calibrated separately, the output transmit power level can be accurately set for a transition between any gain states, even when the transition is achievable at multiple driver-PA gain ranges (e.g., points 950, 952, 954, and 956 in FIG. 9E). The proper linearized value is retrieved from one of four tables, depending on the selected driver-PA gain state. For example, if the driver-PA gain state is "0" the output power is linearized with table #1 (e.g., point 950), if the driver-PA gain state is "1" the output power is linearized with table #2 (e.g., point 952), if the driver-PA gain state is "2" the output power is linearized with table #3 (e.g., point 954), or if the driver-PA gain state is "3" the output power is linearized with table #4 (e.g., point 956).

In an embodiment, the gain linearization mechanism is implemented with look up tables. Each look up table maps the input gain control values to correspond VGA gain control values that provide linear output transmit power level. For example, for a calibration table having ten bits of input resolution and nine bits of output resolution, a table having 1024 by 512 entries is used. The table can be implemented as a ROM, a RAM, a FLASH memory, or other memory technologies.

Output Transmit Power Transients

The change in the gains of the driver-PA and the change in the offsetting gain of the VGA should occur contemporaneously to minimize transients (or glitches) in the output transmit power. The gain control signal TX_AGC for the VGA is filtered by a lowpass filter before being provided to the VGA. A different control mechanism responds to the control signals PA_R0 and PA_R1 to adjust the driver-PA gain. The response time of the lowpass filter is designed to approximate the response time of the control mechanism for the driver-PA. However, this is not assured and differences in the two response times can cause transients or glitches in the output transmit power when the gain of the driver-PA is switched. The glitches can be severe, and can approach the magnitude of the change in the gain of the driver-PA (e.g., +20 dB or more glitches).

Figure 10B:
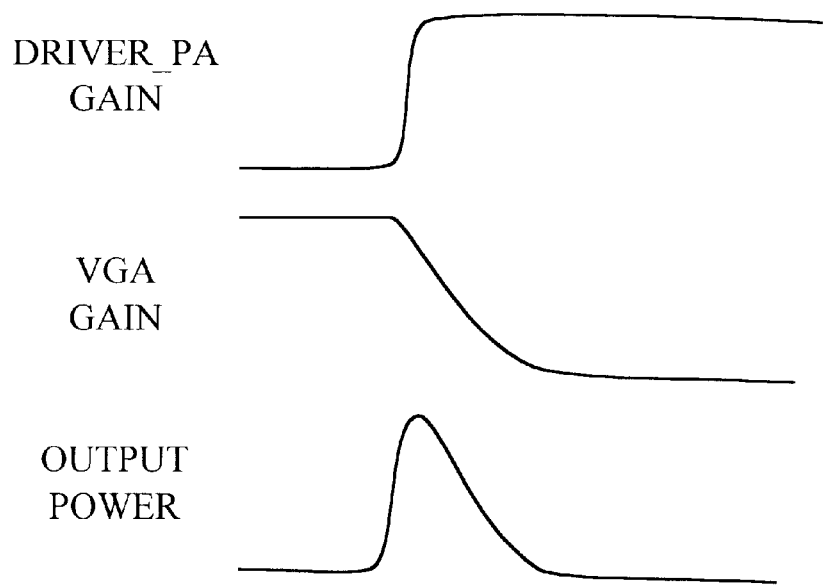
FIGS. 10A and 10B show plots of transients in the output transmit power due to mismatch in the response times of the driver-PA and the VGA for a downward and an upward gain/step change, respectively.
Figure 10A:
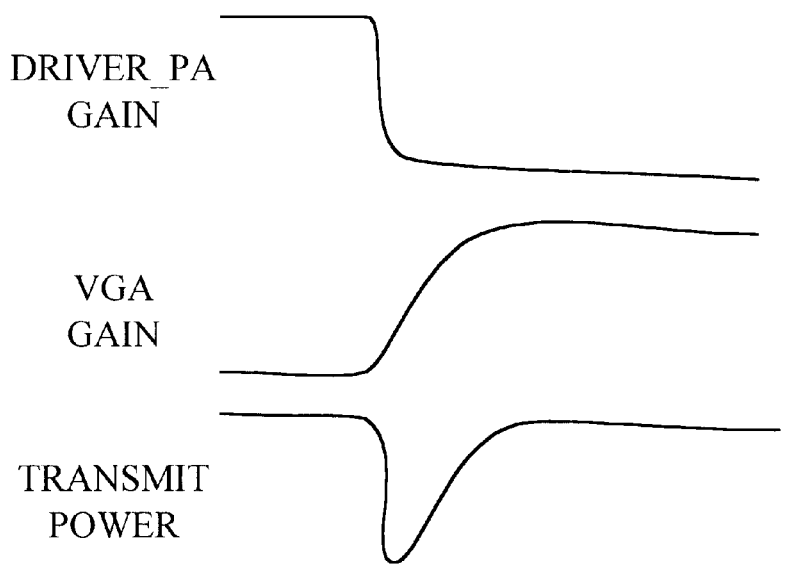

FIGS. 10A and 10B show plots of transients in the output transmit power due to mismatch in the response times of the driver-PA and the VGA for a downward and an upward gain step change, respectively. As shown in FIG. 10A, the response time of the driver-PA is faster than that of the VGA. Thus, the output transmit power decreases when the driver-PA gain is reduced and returns to the nominal value a short time later after the VGA gain reaches its final value. In FIG. 10B, the same mismatch in response times causes an upward glitch in the output transmit power when the driver-PA switches from low to high gain.

Transients in the output transmit power can degrade system performance. Since the capacity of CDMA communications systems is interference limited, upward glitches in the output transmit power of a subscriber unit create additional inference to other subscriber units and reduce the capacity of the cell. In addition, upward glitches can cause a CDMA waveform to fail the IS-98-A specification for spurious emissions when the subscriber unit is transmitting.

In accordance with an aspect of the invention, the gains of the driver-PA and VGA are controlled such that transients in the output transmit power are downward (as shown in FIG. 10A), instead of upward (as shown in FIG. 10B), to reduce interference and to enable the CDMA waveform to conform to the IS-98-A specifications. The duration of the transients is maintained sufficiently short in duration. To ensure that the transients are downward, circuitry is provided to delay the switching of the driver-PA gain when changing to a higher gain state.

Figure 10C:
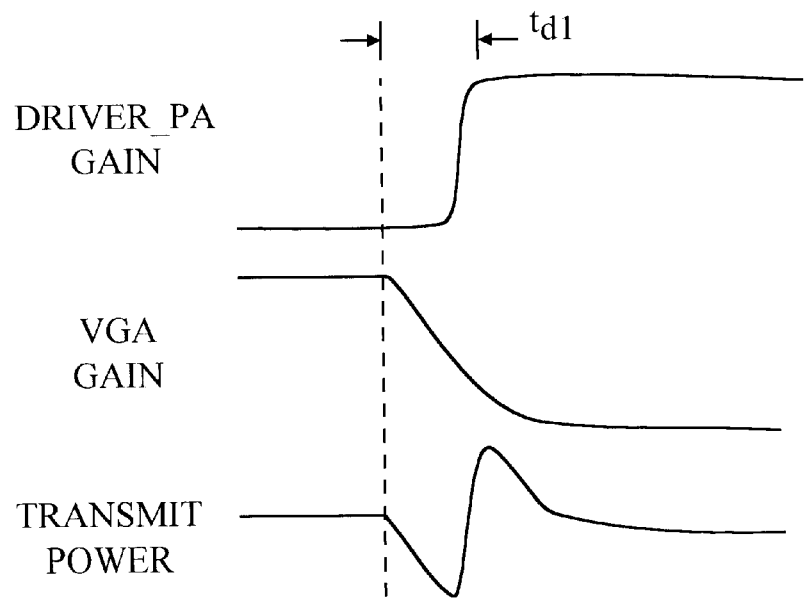
FIGS. 10C and 10D show plots of transients in the output transmit power due to (intentionally introduced) mismatch in the time alignment of the control signals for the driver-PA and the VGA for two different time delays.
Figure 10D:
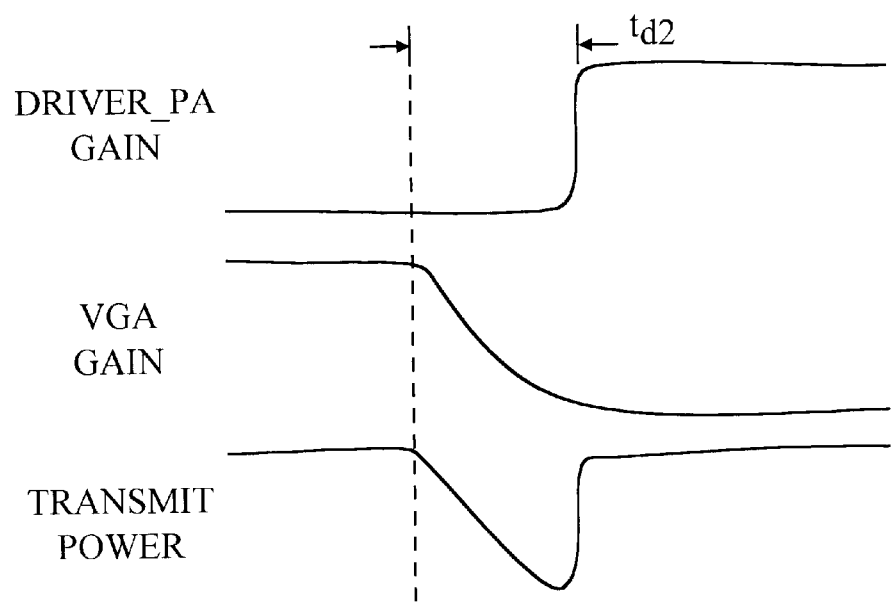

FIGS. 10C and 10D show plots of transients in the output transmit power due to (intentionally introduced) mismatch in the time alignment of the control signals for the driver-PA and the VGA for two different time delays. In FIG. 10C, the control signal for the driver-PA is delay by a time delay $t_{d1}$ that is shorter than the response time of the control signal for the VGA. Thus, the output transmit power transitions downward until the gain of driver-PA is switched. The output transmit power then glitches upward, (possibly) exceeding the nominal output power level, and then transitions downward. In FIG. 10D, the control signal for the driver-PA is delay by a time delay $t_{d2}$ approximately equaled to the response time of the control signal for the VGA. Thus, the output transmit power transitions downward until the gain of driver-PA is switched, at which time the output transmit power returns to its nominal value. As shown by FIGS. 10C and 10D, different transient responses are obtained for different amounts of delay in the driver-PA control signals. In an embodiment, the timing for the control signals for the driver-PA and VGA are not adjusted (i.e., the signals are aligned in the nominal manner) for downward driver-PA gain steps.

Figure 10E:
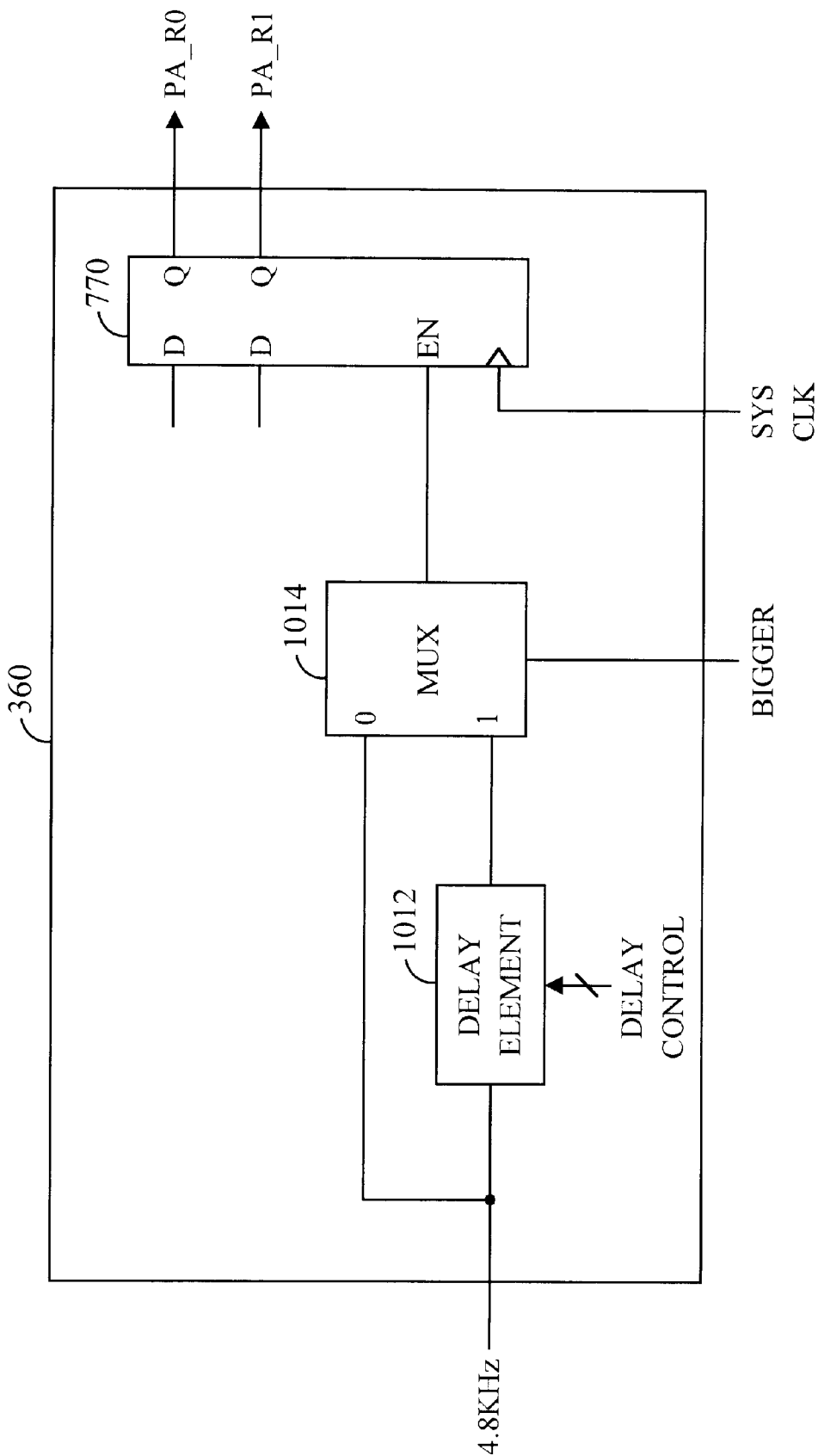
FIG. 10E shows a diagram of an embodiment of circuitry that delays the control signals for the driver-PA to enable control of transients in the output transmit power, when the driver-PA gain is switched.

FIG. 10E shows a diagram of an embodiment of circuitry that delays the control signals for the driver-PA to enable control of transients in the output transmit power when the driver-PA gain is switched. As noted above, the control signals for the driver-PA are updated using the 4.8 kHz clock. Within PA_RANGE control circuit 360, the 4.8 kHz clock is provided to the input of a delay element 1012 and one input of a MUX 1014. The output of delay element 1012 is provided to the other input of MUX 1014. The control signal BIGGER is provided to the control input of MUX 1014. The control signal BIGGER is generated by circuits shown in FIGS. 7B and 7C, and is asserted when the driver-PA changes to a higher gain state. The output of MUX 1014 is the enable signal for latch 770. Latch 770 provides the control signals PA_R0 and PA_R1 for the driver-PA. When the control signal BIGGER is high, indicating a change to a higher driver-PA gain setting, the delayed 4.8 kHz clock is provided to the enable input of latch 770, thereby delaying the transition in the driver-PA control signals. The time delay provided by delay element 1012 can be controlled by a delay control signal. In a specific implementation, delay element 1012 provides programmable delays of 26 µsec, 13 µsec, and 6.5 µsec. Delay element 1012 can also be used to account for different response times of the VGA control signal due to time response adjust circuit 412 shown in FIG. 4. Other delay values can also be used depending on the particular implementation of the transmitter and system requirements.

Power Conservation

To minimize interference and conserve power, each subscriber unit transmits at a different bit rate depending on the level of speech activity in the conversation of the user. Within the subscriber unit, a variable rate speech vocoder provides speech data at full rate when the user is actively speaking and at low rate during periods of silence (e.g., pauses). The variable rate vocoder is described in detail in U.S. Pat. No. 5,414,796, entitled "Variable Rate Vocoder," assigned to the assignee of the present invention and incorporated herein by reference. CDMA communications systems increase the reverse link capacity by transmitting fewer bits, thereby using less power and reducing interference, when the user reduces speech activity or stops speaking.

On the reverse link, interference is reduced by turning off the transmitter for a fraction of the time during periods when speech activity is low. In accordance with IS-95-A standards, the transmitter is turned on or off in particular increments of time (e.g., 1.25 msec) referred to as "power control groups." A power control group is considered "valid" if data is transmitted during that time increment.

In accordance with an aspect of the invention, in addition to powering the PA off during power control groups when no transmissions occur, control mechanisms are provided to: (1) power down the PA when not necessary to provide the required output transmit power level, even during "valid" power control groups, or (2) power down the entire signal path of the transmit chain, as well as associated biasing circuitry, when the phone is not transmitting, or both (1) and (2). It has been discovered that during certain situations (e.g., at low output transmit power levels), the required output transmit power level during transmission can be provided by the driver alone. In these situations, the PA can be bypassed and powered down to conserve power. It has also been discovered that in certain other situations (e.g., during power control groups where no transmissions occur), the entire transmit signal path can be powered down to provide even greater power savings. The power savings are especially advantageous in mobile subscriber units and beneficially increase standby and talk times.

PAs are typically powered on, warmed up for a particular warm-up period, and stabilized at an appropriate bias before they are used (i.e., provided with the RF signal). Failure to properly warm up the PAs results in transients in the output transmit power that can degrade system performance. The warm up time can range from 150 µsec to 500 µsec, or more, depending on the particular PA design.

Figure 11A:
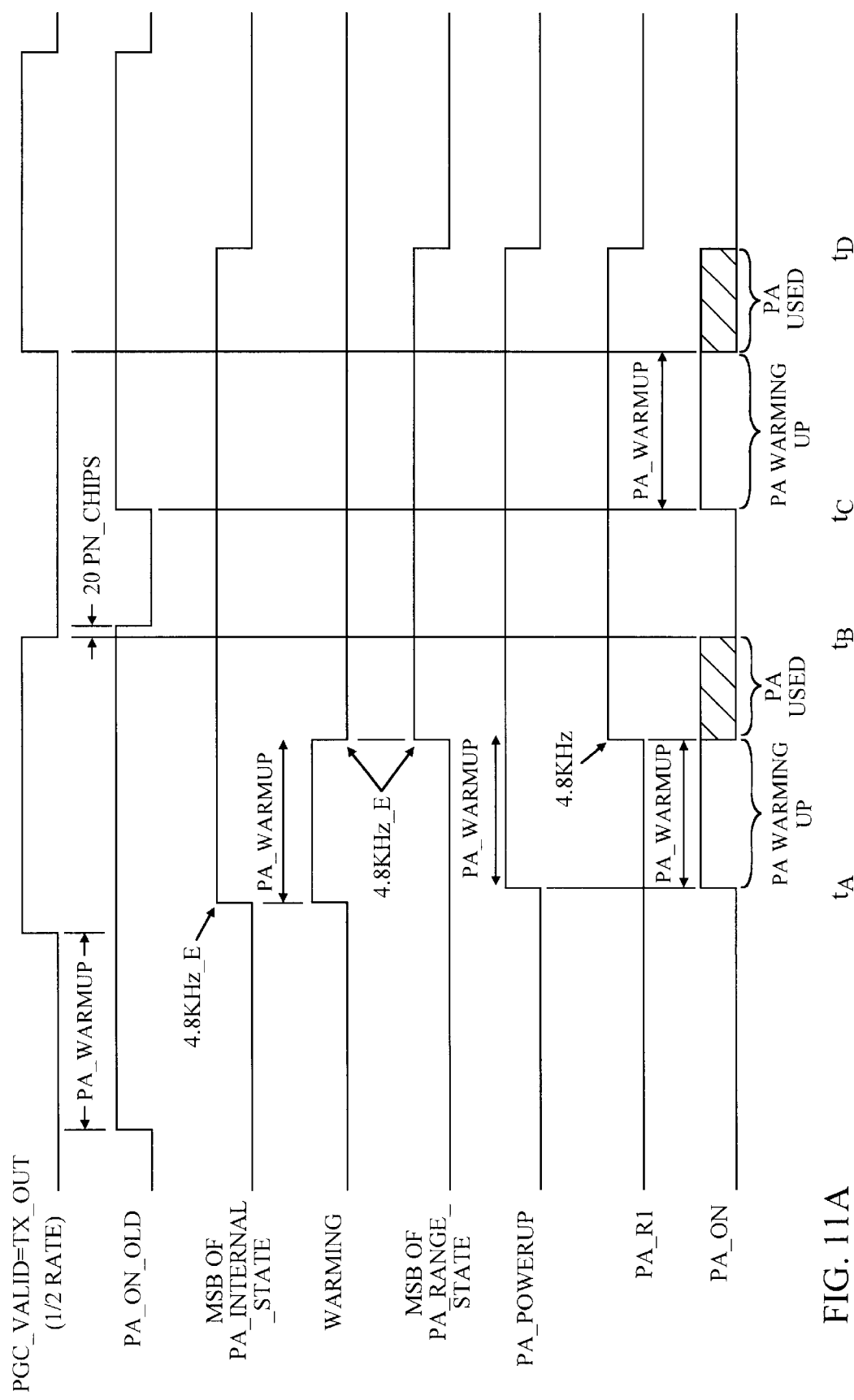
FIG. 11A and 11B show timing diagrams of the signals used to control the PA and the transmit chain in accordance with an aspect of the invention.
Figure 11B:
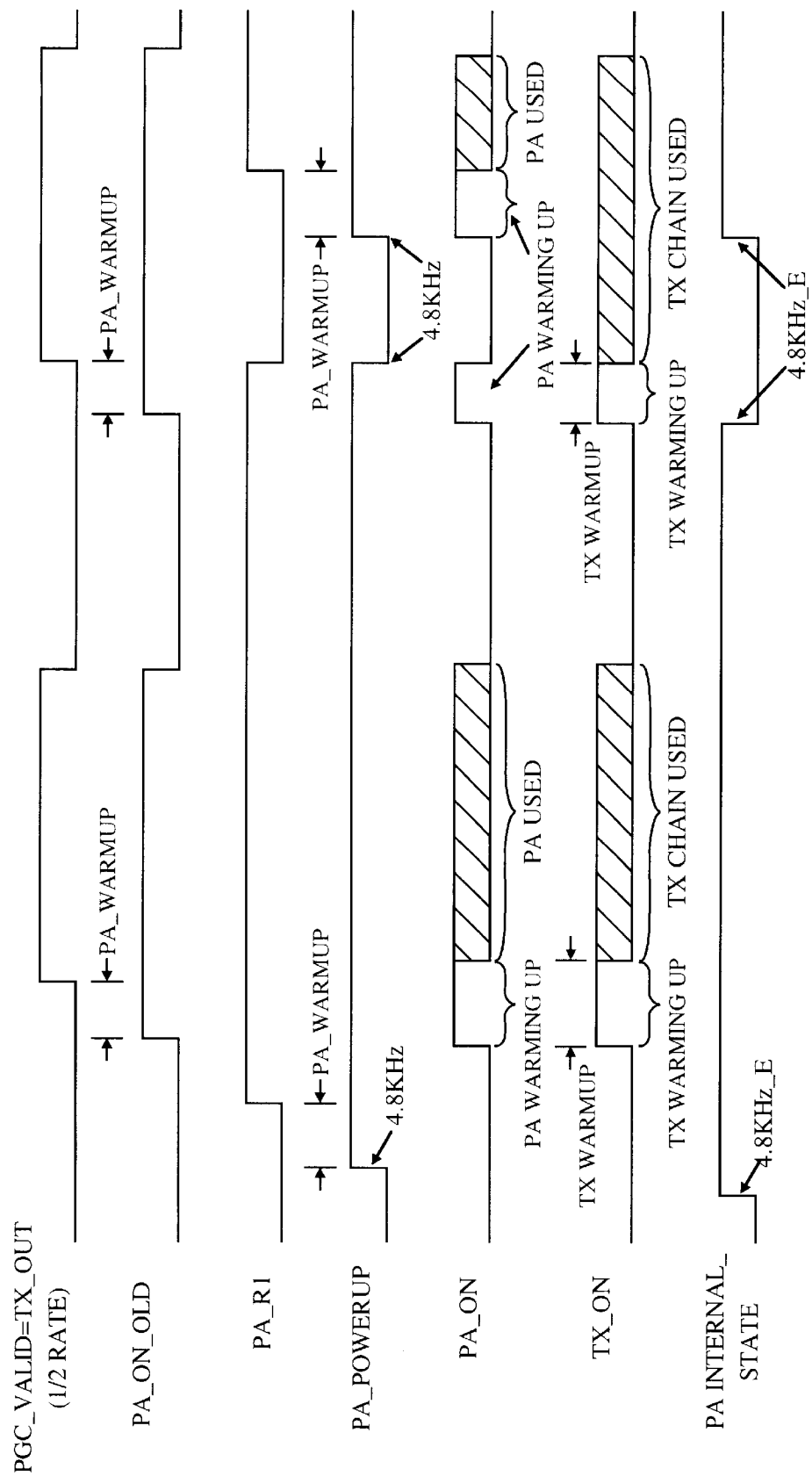

FIGS. 11A and 11B shows timing diagrams of the signals used to control the PA and the transmit chain in accordance with an embodiment of the invention. The control signal TX_OUT indicates valid power control groups, or times when data is transmitted by the subscriber unit. As noted above, each power control group has a particular period (e.g., 1.25 msec for IS-95-A compliant systems). The control signal TX_OUT is dependent, for example, on speech activity of the user. The control signal PA_INTERNAL_STATE1 indicates times when the power gain of the PA is required. It has been discovered that below a certain output transmit power level, the PA can be bypassed and powered down since the driver alone can provide the required power level. The control signal PA_INTERNAL_STATE1 is dependent, for example, on the operating conditions of the subscriber unit. The control signal PA_INTERNAL_STATE1 is, in turn, used to derive the control signals PA_POWERUP and PA_R1. The control signal PA_POWERUP indicates when the PA needs to be turned on during transmission (including warm-up time), and the control signal PA_R1 indicates when the warmed up PA is to be used.

Referring to FIGS. 8A and 8B, these PA architectures allow for bypassing of the PA by switching the input RF signal to the output via a bypass path. The control signals SW0 and SW1 for the switches that bypass the PA also control the gain of the PA, and can be derived from the control signals PA_R0 and PA_R1 that identify the driver-PA gain state. For example, in both architectures shown in FIGS. 8A and 8B, the control signal PA_R1 is related to the switch control signal SW1 (and in the architecture shown in FIG. 8A, the control signal PA_R0 is related to the switch control signal SW0). The control signal PA_WARMUP is used to generate the signal PA_ON that controls the powering on and off of the PA.

The driver-PA gain is typically set to a high gain when high output transmit power level is required. Referring to FIG. 9D, as the output transmit power level increases, more gain is provided by the driver-PA. For the specific embodiment shown in Table 1, the PA is powered on and in use for gain states 10 and 11, the gain states corresponding to the two highest driver-PA gain settings.

Figure 11C:
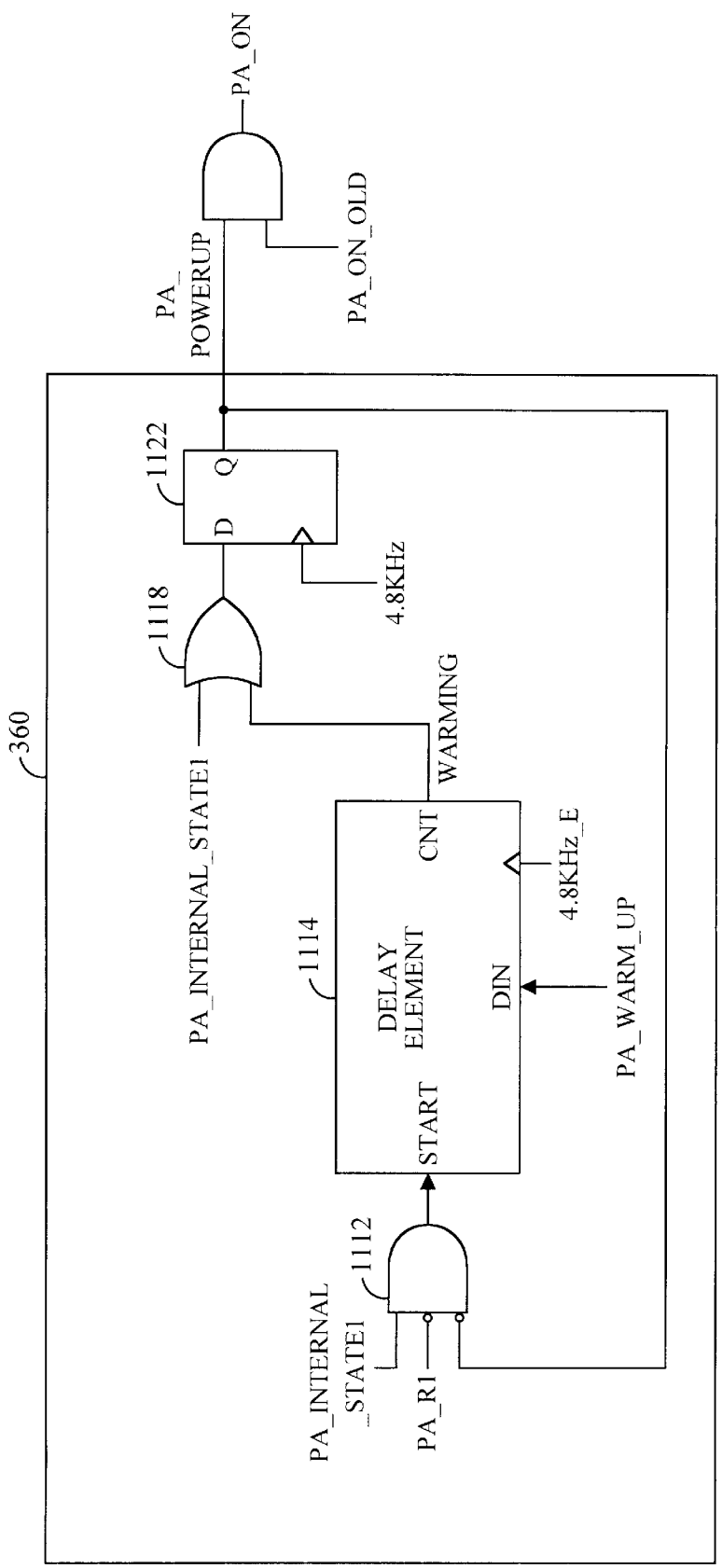
FIG. 11C shows a diagram of an embodiment of circuitry that generates the control signal PA_ON to power on and off the PA.

In an embodiment, as shown in FIG. 11C and as illustrated in the timing diagrams of FIGS. 11A and 11B, the control signal PA_ON that powers on and off the PA is derived from both the PA_ON_old and PA_POWERUP control signals. The control signal PA_ON_old controls the powering on/off of the PA during "invalid" power control groups, and the control signal PA_POWERUP controls the power on/off of the PA during "valid" power control groups. In an embodiment, the PA is powered on during valid power control groups (when the transmitter is transmitting data) and when the PA is needed to provide the required power level. The control signal PA_ON is thus asserted when the control signals PA_ON_old and PA_POWERUP are both asserted. However, the control signal PA_ON is asserted a particular amount of time ($t_{PA\_WARM\_UP}$) before the arrival of the RF signal at the PA input (e.g., at times $t_A$ and $t_C$). The PA warm up time ($t_{PA\_WARM\_UP}$) can be programmable based on the requirements of the particular PA design. The PA can typically be powered down immediately when not needed (e.g., at times $t_B$ and $t_D$) without degrading system performance.

In an embodiment, the transmit signal path and the biasing circuitry are powered on during valid power control groups and powered off when no data transmissions occur. The control signal TX_ON is thus asserted when the control signal TX_OUT is asserted. However, the control signal TX_ON is asserted a particular amount of time ($t_{TX\_WARM\_UP}$) before the arrival of the signal at the input of the transmit signal path (e.g., at times $t_A$ and $t_C$). The warm up time of the transmit signal path ($t_{TX\_WARM\_UP}$) can also be programmable based on the requirements of the particular transmit signal path design. Also, the warm up time of the chain ($t_{TX\_WARM\_UP}$) can be similar or different from the warm up time of the PA ($t_{PA\_WARM\_UP}$) Referring to the transmitter architecture shown in FIG. 2, the control signal TX_ON can be used to power down VGA 220, mixer 222, and driver 226.

FIG. 11C shows a diagram of an embodiment of circuitry that generates the control signal PA_ON to power on and off the PA. The control signals PA_R1 and PA_INTERNAL_STATE1 are provided to an inverting and a non-inverting input, respectively, of an AND gate 1112. The previous value of the control signal PA_POWERUP[n−1] is provided to another inverting input of AND gate 1112. The output of AND gate 1112 is a signal indicating that the PA needs to be warmed up, and is provided to the input of a delay element 1114. Delay element 1114 delays the signal by a particular delay, as indicated by the control input PA_WARMUP. The output from delay element 1114 is a pulse corresponding to the required warm up time for the PA, and is provided to an input of a OR gate 1118. The control signal PA_INTERNAL_STATE1, which is asserted when the PA becomes required, is provided to the other input of OR gate 1118. The output of OR gate is provided to the data input of a latch 1122 that synchronizes this control signal with other controls signals for the transmit signal path. The output from latch 1122 comprises the control signal PA_POWERUP. The control signals PA_POWERUP and PA_ON_old are then ANDed to provide the control signal PA_ON The control signal TX_ON can be generated in a manner similar to that of the control signal PA_ON_old.

Figure 11D:
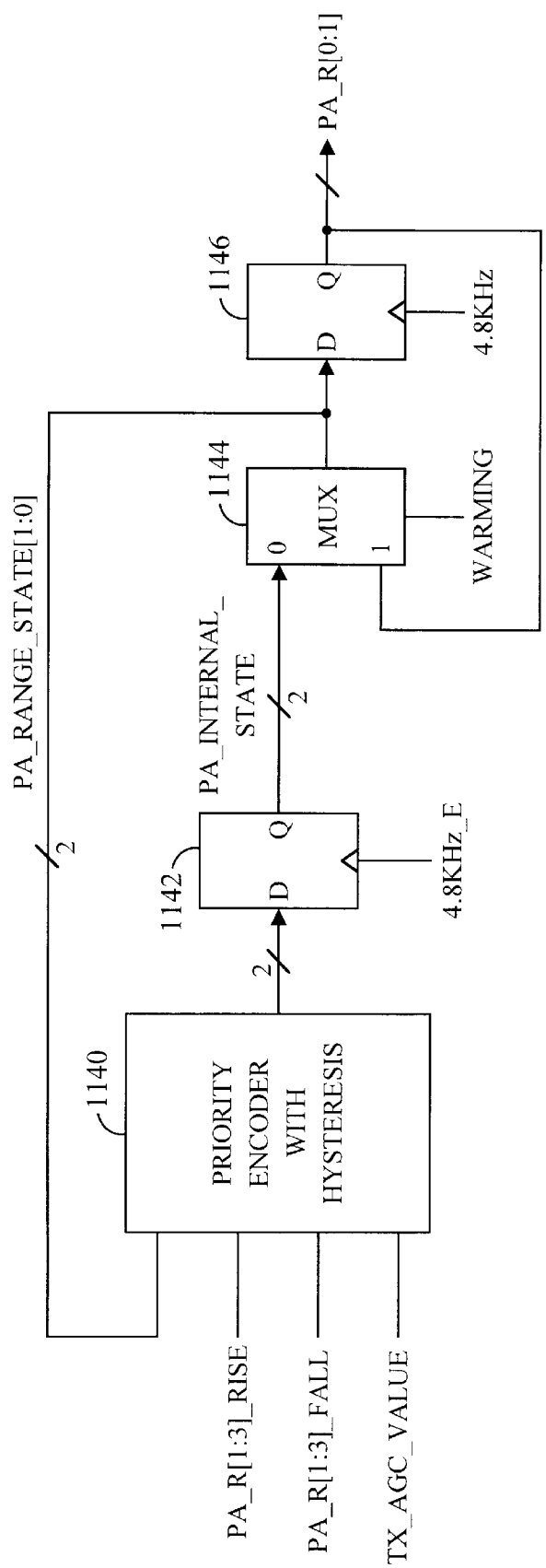
FIG. 11D shows a diagram of an embodiment of circuitry that generates the control signals PA_R[1:0].

FIG. 11D shows a diagram of an embodiment of circuitry that generates the control signals PA_R[1:0]. The control signals PA_R[1:3]RISE and PA_R[1:3]_FALL, the previous control signals PA_RANGE_STATE[1:0], and the TX_AGC_VALUE are provided to a priority encoder (with hysteresis) 1140 that provides a set of control signals. These signals are latched by a flip-flop 1142 with the 4.8 kHz_E clock to provide the control signals PA_INTERNAL_STATE[1:0]. The control signals PA_INTERNAL_STATE [1:0] and PAR[1:0] are provided to a MUX 1144 that selects one of the control signal set based on a control signal WARMING. The output from MUX 1144 are latched by a flip-flop 1146 with the 4.8 kHz clock to provide the control signals PAR[1:0].

In summary, when the required transmit power dictates the need for a change in the PA range state from bypassed (e.g., 00, 01) to non-bypassed (e.g., 10, 11), or equivalently when PA_INTERNAL_STATE1 transitions from 0 to 1 and PA_POWERUP is 0, the PA_POWERUP is asserted high at the next 4.8 kHz clock. PA_POWERUP stays high for at least the duration of (software programmable) period PA_WARMUP period (i.e., while the signal WARMING in FIG. 11C is high) so that the PA is warmed up before it is used. PA_POWERUP remains high for as long as PA_INTERNAL1 is high, or as long as the PA is in use. This is illustrated in FIG. 11C.

FIG. 11D illustrates that as long as WARMING is high (i.e., the PA is warming up), the true internal state PA_RANGE_STATE[1:0], as well as pins PAR[1:0], will hold the previous bypass PA states (00, 01), even though PA_INTERNAL_STATE[1:0] is dictating a change to non-bypass states (10, 11). This ensures that the PA will not be used before it is warmed up. After the (software programmable) PA_WARMUP time expires, the signal WARMING transitions low, indicating that the PA is warmed up and ready for use. MUX 1144 in FIG. 11D then allows the new non-bypass states (10, 11) propagate to true PA internal state PA_RANGE_STATE[1:0], as well as pins PA_R[1:0], indicating that the PA can now be used. Switches SW1 in FIGS. 8A and 8B around the PA can then be closed (i.e., PA_R1 is high), the warmed-up PA is now in use, and the appropriate gain step is subtracted from the VGA gain. PA_RANGE_STATE[1:0] controls the subtraction of appropriate gain step GAIN_OFFSET[0–3] from the VGA, as shown in FIG. 6. The PA remains in use for as long as operating condition dictates non-bypass PA states (10, 11), i.e., as long as PA_INTERNAL1 is high.

In the embodiment shown in FIG. 11A, the PA is powered down when the transmitter is gated-off (e.g., periods of no data transmissions) and when the PA is not needed (e.g., when low output transmit power level is required) during transmissions.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A method for adjusting a gain of a circuit element in a transmitter comprising:

receiving a gain control signal that includes gain setting values for the circuit element;

generating overdrive pulses corresponding to changes in the gain setting values in the gain control signal;

summing the overdrive pulses with the gain setting values to generate an adjusted control signal;

filtering the adjusted control signal to generate a filtered control signal; and adjusting the gain of the circuit element in accordance with the filtered control signal.

2. The method of claim 1, further comprising:

modulating the adjusted control signal with a pulse modulator to generate a modulator signal, wherein the filtering is performed on the modulator signal to generate the filtered control signal.

3. The method of claim 1, wherein the pulse modulator is a sigma-delta modulator.

4. The method of claim 1, wherein the overdrive pulses have amplitudes that are related to magnitudes of changes in the gain setting values.

5. The method of claim 1, wherein the overdrive pulses have programmable duration.

6. The method of claim 1, wherein the filtering is performed by a lowpass filter having an order greater than one.

7. The method of claim 1, wherein the circuit element is a variable gain amplifier.

8. A method for adjusting signal gain in a transmitter having a first gain element and a second gain element, wherein the first gain element responds to a first update clock and the second gain element responds to a second update clock, the first and second update clocks being asynchronous, the method comprising:

determining a first gain transfer characteristic of the first gain element;

determining a second gain transfer characteristic of the second gain element;

receiving a first gain setting value for the first gain element and a second gain setting value for the second gain element;

adjusting the second gain setting value with a particular gain offset value based on the first gain setting value;

determining a linearized gain setting value corresponding to the adjusted second gain setting value;

adjusting a gain of the first gain element with the first gain setting value; and adjusting a gain of the second gain element with the linearized gain setting value.

9. The method of claim 8, further comprising:

adjusting the gain of the first gain element at a first update time;

detecting a change in the first gain setting value; and if a change is detected, adjusting the gain of the second gain element at the first update time.

10. The method of claim 8, further comprising:

generating a gain compensation table based on the first and second gain transfer characteristics, and wherein the determining the linearized gain setting value is performed by retrieving the linearized gain setting value from the gain compensation table corresponding to the adjusted second gain setting value.

11. A method for adjusting signal gain in a transmitter having a first gain element and a second gain element, wherein the first gain element responds to a first update clock and the second gain element responds to a second update clock, wherein the second update clock is faster than the first update clock and the first and second update clocks are asynchronous, the method comprising:

receiving a first gain setting value for the first gain element and a second gain setting value for the second gain element;

generating a first gain control signal representative of the first gain setting value;

generating a second gain control signal representative of the second gain setting value;

aligning the first gain control signal with the first update clock;

detecting a change in gain setting value of the first gain element;

if a change in gain setting value is detected, aligning the second gain control signal with the first update clock;

if no change in gain setting value is detected, aligning the second and gain control signal with the second update clock;

adjusting a gain of the first gain element with the aligned first gain control signal; and adjusting a gain of the second gain element with the aligned second gain control signal.

12. The method of claim 11, further comprising:

adjusting the second gain setting value with a particular gain offset value based on the first gain setting value, and wherein the second gain control signal is representative of the adjusted second gain setting value.

13. A method for providing linear adjustment of output power level from a transmitter, wherein the transmitter includes an element having a plurality of discrete gain settings and an element having a variable gain setting, the method comprising:

determining a gain transfer function of the transmitter for each of the plurality of discrete gain settings;

for each of the plurality of discrete gain settings, generating a gain compensation table based on the determined gain transfer function;

receiving a first gain setting value for the element having a plurality of discrete gain settings, wherein the first gain setting value identifies one of the plurality of discrete gain settings;

receiving a second gain setting value for the element having variable gain setting;

retrieving a compensated gain setting value from the gain compensation table corresponding to discrete gain setting identified by the first gain setting value;

adjusting a gain of the element having the plurality of discrete gain settings with the first gain setting value; and adjusting a gain of the element having the variable gain setting with the compensated gain setting value.

14. The method of claim 13, wherein the determining a gain transfer function comprises:

setting the element having the plurality of discrete gain settings to a particular gain setting;

stepping though a gain range of the element having the variable gain setting;

detecting output power level from the transmitter; and repeating the setting, stepping, and detecting for each of the plurality of discrete gain settings.

15. The method of claim 13, wherein the gain compensation tables are stored in a look up table.

16. The method of claim 13, wherein the second gain setting value includes a command to increase or decrease the output power level from the transmitter by a particular amount.

17. The method of claim 13, wherein each of the plurality of discrete gain settings is associated with a particular range of output power levels from the transmitter.

18. The method of claim 17, wherein the particular ranges of output power levels associated with the plurality of discrete gain settings overlap to create hysteresis.

19. The method of claim 17, wherein each particular range of output power levels associated with each discrete gain setting is extended to cover full dynamic range of required output power.

20. A method for controlling transients in an output power of a transmitter during a signal transmission, wherein the transmitter includes a first element having a first time response and a second gain element having a second time response, wherein the first time response is faster than the second time response, the method comprising:

receiving a first command to adjust a gain of the first element;

receiving a second command to adjust a pain of the second element;

delaying the first command by a particular time period;

adjusting the gain of the second gain element in accordance with the second command; and adjusting the gain of the first gain element in accordance with the delayed first command;

wherein the particular time period is selected to reduce increase in output power level of the transmitter due to adjustment of the gains of the first and second elements.

21. A method for controlling transients in an output power of a transmitter during a signal transmission, wherein the transmitter includes a first element having a first time response and a second gain element having a second time response, wherein the first time response is faster than the second time response, the method comprising:

receiving a first command to adjust a gain of the first element;

receiving a second command to adjust a gain of the second element;

delaying the first command by a particular time period;

adjusting the gain of the second gain element in accordance with the second command; and adjusting the gain of the first gain element in accordance with the delayed first command;

wherein the delaying is performed when the first command directs an increase in the gain of the first element.

* * * * *